United States Patent
Sasaka

(10) Patent No.: US 6,730,579 B1
(45) Date of Patent: May 4, 2004

(54) METHOD OF MANUFACTURING A SEMICONDUCTOR DICE BY PARTIALLY DICING THE SUBSTRATE AND SUBSEQUENT CHEMICAL ETCHING

(75) Inventor: Shigeyuki Sasaka, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/487,259

(22) Filed: Jan. 19, 2000

(30) Foreign Application Priority Data

Feb. 5, 1999 (JP) .......................................... 11-028657

(51) Int. Cl.⁷ .................... H01L 21/304; H01L 21/3063
(52) U.S. Cl. ..................................................... 438/464
(58) Field of Search ................................ 438/455, 458, 438/460, 462, 464

(56) References Cited

U.S. PATENT DOCUMENTS 5,893,746 A  *  4/1999  Usami et al. ............... 438/455

FOREIGN PATENT DOCUMENTS

| JP | 49-115662 | 1/1974 |
|----|-----------|--------|
| JP | 52-079654 | 7/1977 |
| JP | 54-078081 | 6/1979 |
| JP | 63-117445 A | 5/1988 |
| JP | 63-164336 | 7/1988 |
| JP | 64-073739 | 3/1989 |
| JP | 01-186646 | 7/1989 |
| JP | 03-183153 | 8/1991 |
| JP | 03-270156 | 12/1991 |
| JP | 04-162647 | 6/1992 |
| JP | 05-021597 | 1/1993 |
| JP | 06-216241 | 8/1994 |
| JP | 7-22358 A | 1/1995 |
| JP | 7-161665 A | 6/1995 |
| JP | 7-20185 A | 8/1995 |
| JP | 07-201784 | 8/1995 |
| JP | 2737859 B2 | 1/1998 |
| JP | 2000-091274 | * 3/2000 | ......... H01L/21/301 |

OTHER PUBLICATIONS

U. Efrat, Optimizing the Wafer Dicing Process. 1993 IEEE, pp. 245–253.*
N. Umehara et al., Application of Die Attachless Process for Plastic Packages. 1997 IEEE, pp. 979–985.*

* cited by examiner

Primary Examiner—Wael Fahmy
Assistant Examiner—Anh Duy Mai
(74) Attorney, Agent, or Firm—Nixon & Vanderhye, PC

(57) ABSTRACT

A manufacturing method for a semiconductor device is provided with the steps of: semi-full dicing a semiconductor wafer so as to leave a dicing residual portion with a predetermined thickness between devices on the semiconductor wafer; forming a protective layer having a chemical etching resistant property on an element formation face of the semiconductor wafer; chemically etching the semiconductor wafer having the protective layer formed on the element formation face from the rear face side so as to polish the rear face of the semiconductor water, so as to remove the dicing residual portion to divide the semiconductor wafer into individual semiconductor chips, and so as to remove damaged areas in a cut face of the semiconductor wafer resulted from the semi-full dicing process. Thus, it becomes possible to reduce the number of processes, and also to carry out a polishing process and a dicing process safely without giving damages to the semiconductor wafer and without causing cracks and chips therein.

20 Claims, 17 Drawing Sheets

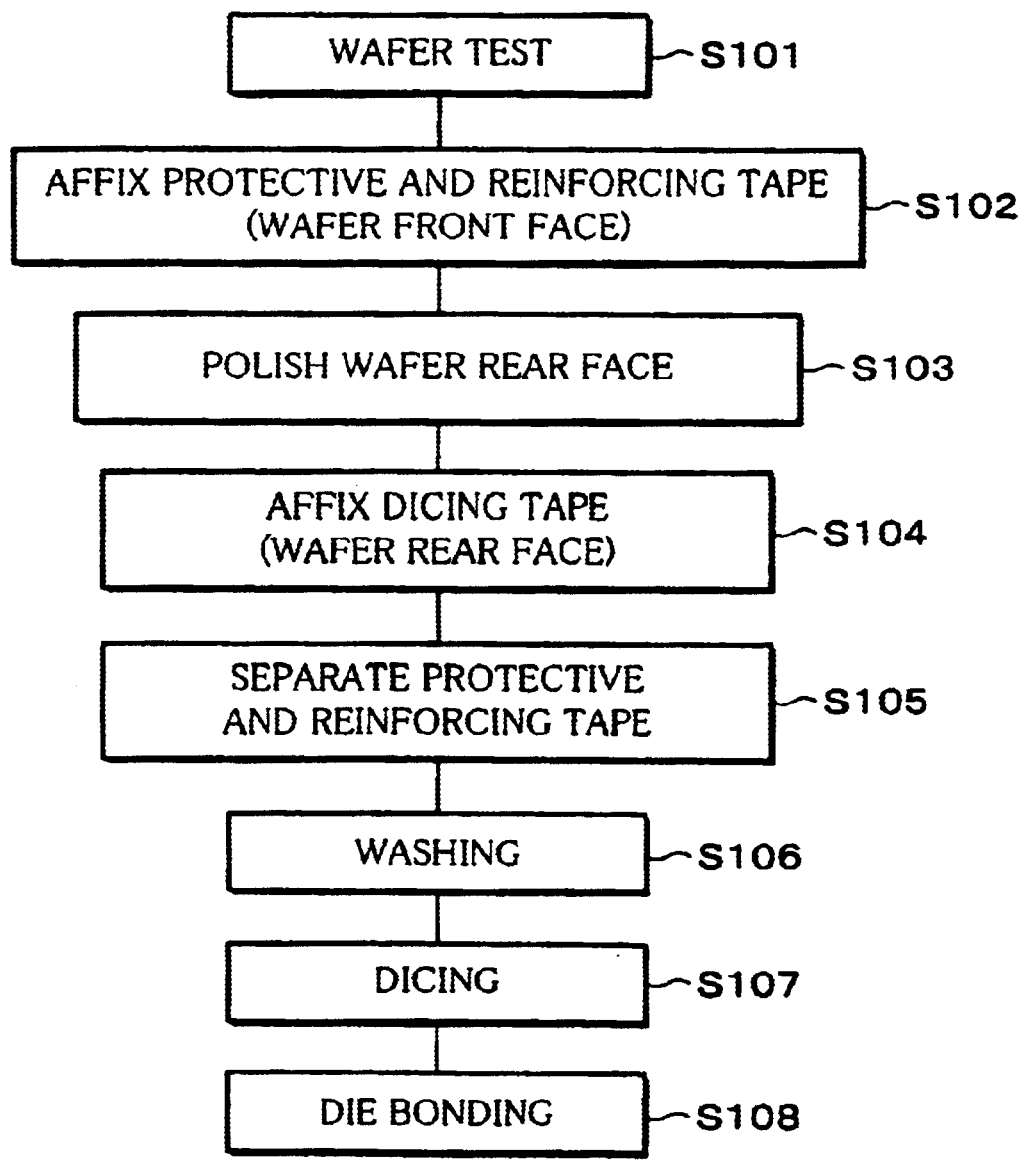

FIG. 12 (a) *(Prior Art)* 
FIG. 12 (b) *(Prior Art)* 
FIG. 12 (c) *(Prior Art)* 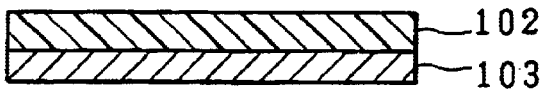
FIG. 12 (d) *(Prior Art)* 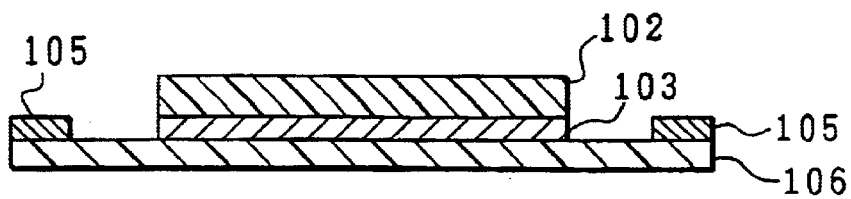
FIG. 12 (e) *(Prior Art)* 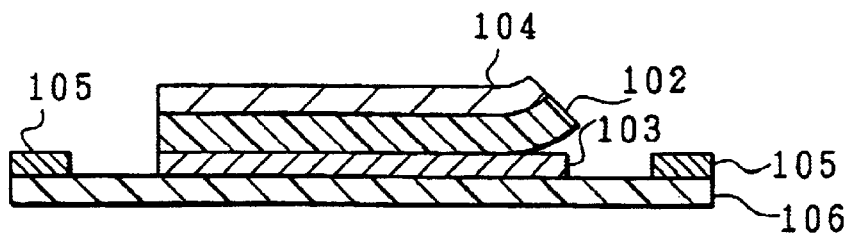
FIG. 12 (f) *(Prior Art)* 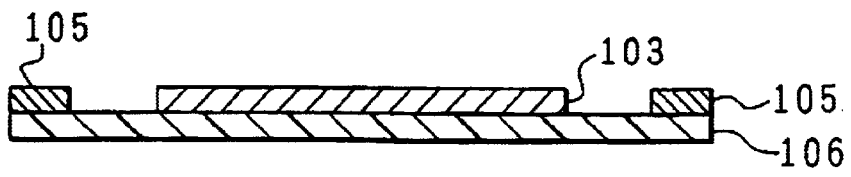
FIG. 12 (g) *(Prior Art)* 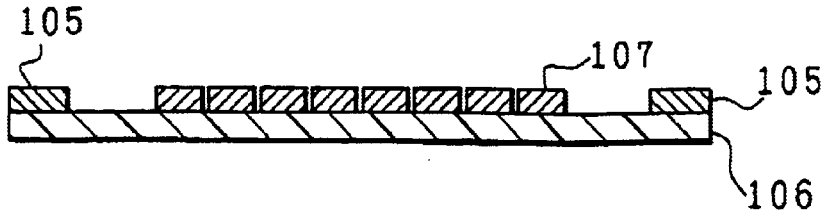

FIG. 14 (a) (Prior Art)
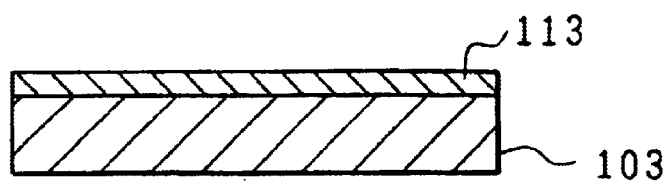
FIG. 14 (b) (Prior Art)
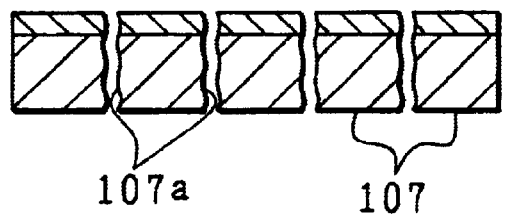
FIG. 14 (c) (Prior Art)
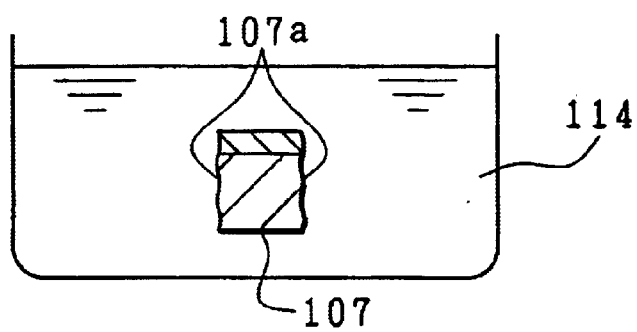
FIG. 14 (d) (Prior Art)
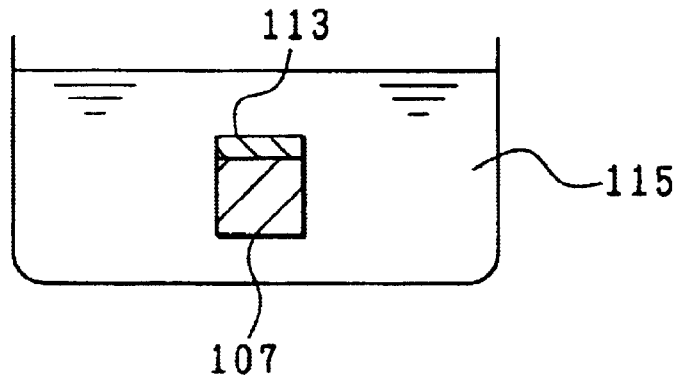

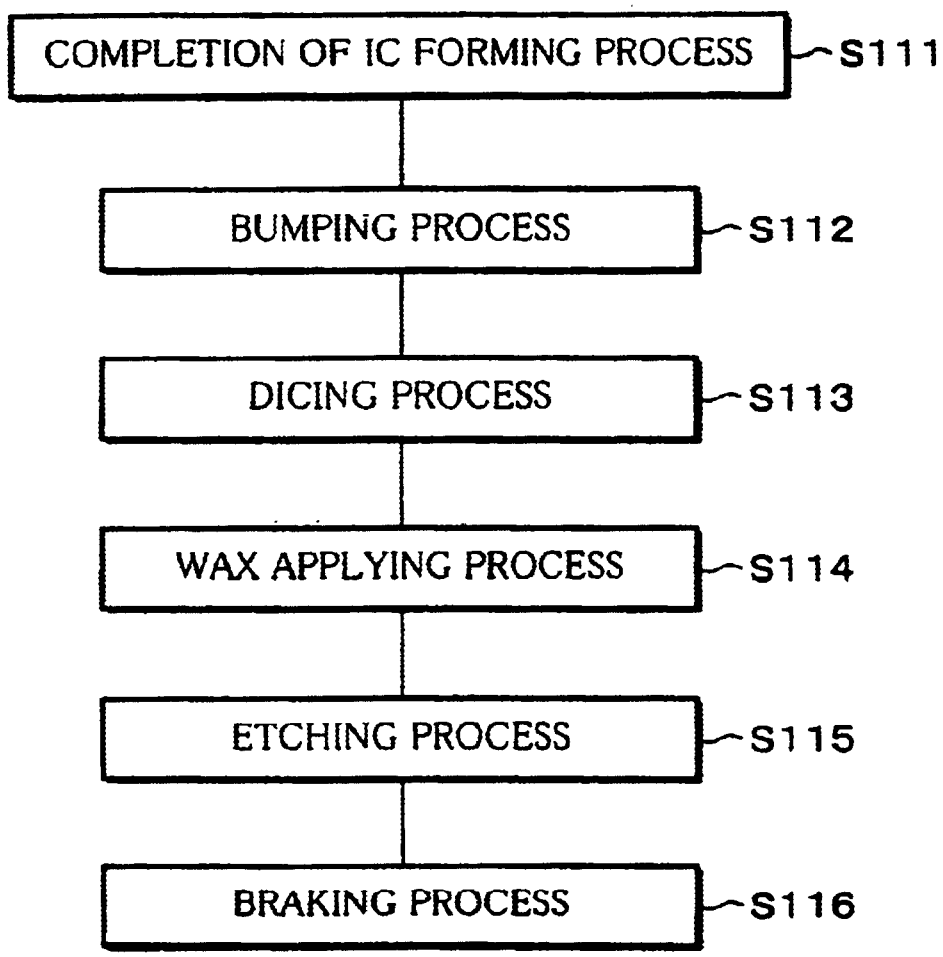

FIG. 16 (a) (Prior Art) 
FIG. 16 (b) (Prior Art) 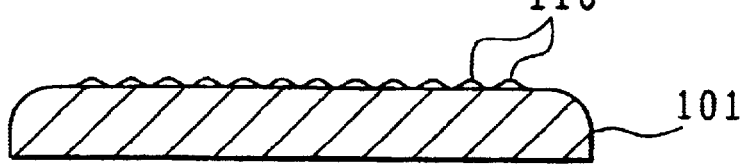
FIG. 16 (c) (Prior Art) 
FIG. 16 (d) (Prior Art) 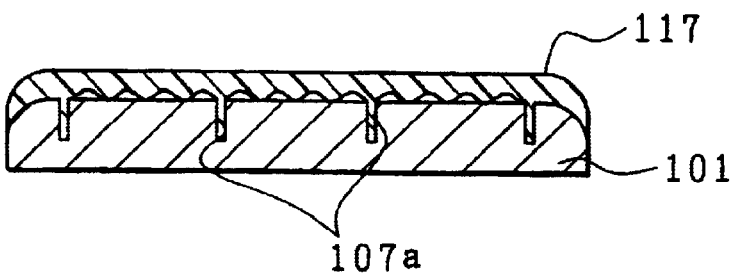
FIG. 16 (e) (Prior Art) 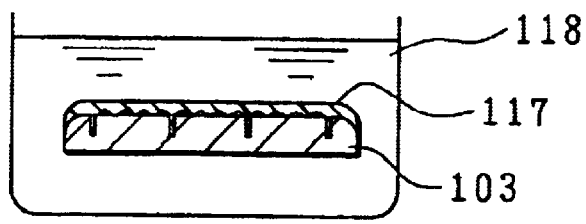
FIG. 16 (f) (Prior Art) 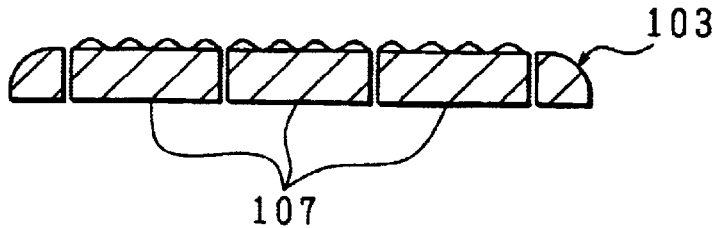

FIG. 17 (a) *(Prior Art)*
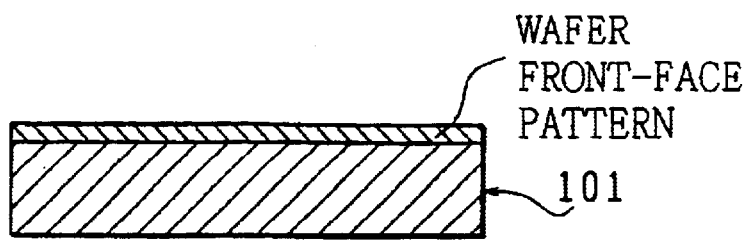
FIG. 17 (b) *(Prior Art)*
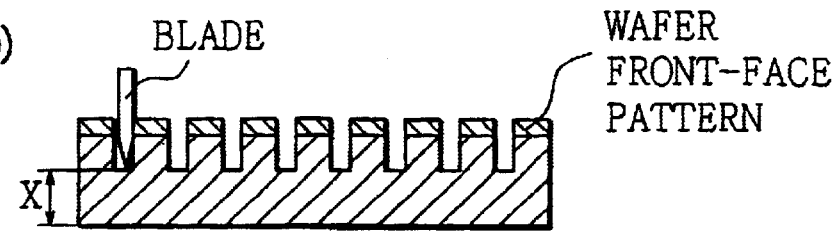
FIG. 17 (c) *(Prior Art)*
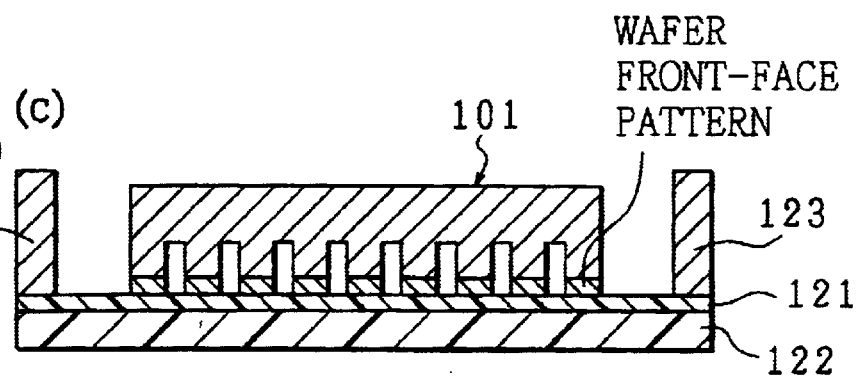
FIG. 17 (d) *(Prior Art)*
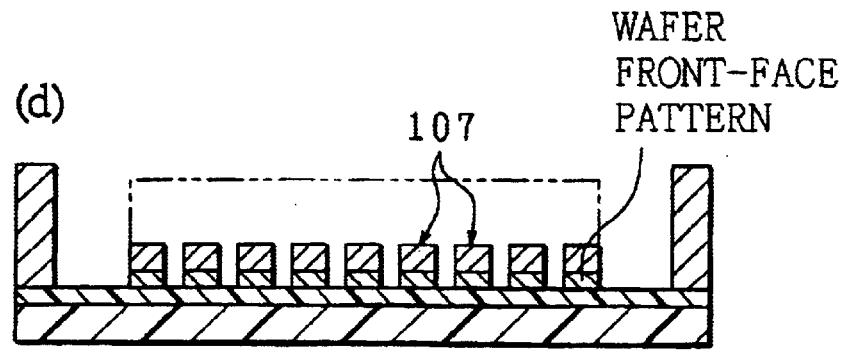
FIG. 17 (e) *(Prior Art)*
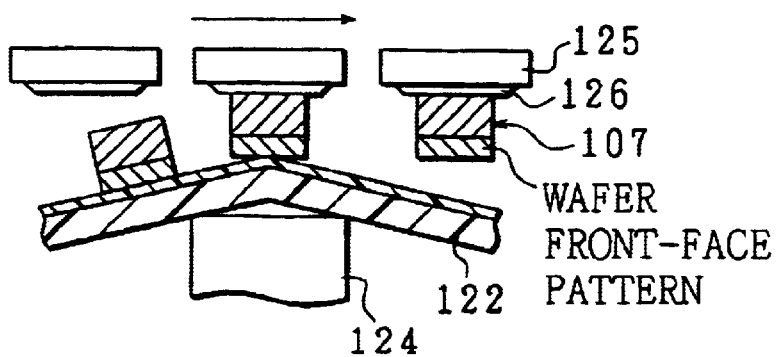

METHOD OF MANUFACTURING A SEMICONDUCTOR DICE BY PARTIALLY DICING THE SUBSTRATE AND SUBSEQUENT CHEMICAL ETCHING

FIELD OF THE INVENTION

The present invention relates to a manufacturing method os a semiconductor device, and more specifically concerns a polishing process and a dicing process of a semiconductor wafer.

BACKGROUND OF THE INVENTION

[Prior Art Example 1]

Referring to FIG. 11 and FIGS. 12(a) to FIG. 12(g), the following description will discuss processes from the rear-face polishing process to the dicing process of a semiconductor wafer disclosed in Japanese Laid-Open Patent Application No. 22358/1995 (Tokukaihei 7-22358, published on Jan. 24, 1995).

Before a rear-face polishing process, a semiconductor wafer 101 is subjected to an electrical test by means of probing (hereinafter referred to as "wafer test") (S101, see FIG. 12(a)) and a protection and reinforcing tape 102 is affixed onto the front face (element formation face) thereof (see S102, FIG. 12(b)). The protection and reinforcing tape 102 is formed by, for example, laminating an acrylic bonding agent onto a polyethylene terephthalate (PET) film.

After polishing the rear face of the semiconductor wafer 101 (S103, FIG. 12(c)), the rear face of the semiconductor wafer 103 is affixed onto a dicing tape 106 through a carrier frame 105 with the protection and reinforcing tape 102 being affixed on the front face thereof (S104, FIG. 12(d)).

Next, the protection and reinforcing tape 102 is separated from the front face of the semiconductor wafer 103 (S105, FIG. 12(e)). In this case, as illustrated in FIG. 12(e), a separation tape 104, which has a greater adhesive force than the adhesive force between the protection and reinforcing tape 102 and the semiconductor wafer 103, is used so as to separate the protection and reinforcing tape 102.

Successively, after washing residual bonding agent from the front face of the semiconductor wafer 103 by means of ultrasonic washing with pure water (S106, FIG. 12(f)), the semiconductor wafer 103 is full-cut or semi-full-cut through a dicing process using a diamond wheel so that a semiconductor chip 107 having a predetermined size is formed (S107, FIG. 12(g)).

Next, the sequence proceeds to a die bonding process. In the die bonding process, only one of the semiconductor chips 107 is pushed up by a pin from the rear face of the semiconductor wafer 103 through the dicing tape 106 so that this is subjected to a die bonding process by using the die bonding collet 103 (S108). Here, those semiconductor wafers 103 that have been subjected to the semi-full dicing process undergo the die bonding process after a breaking process.

In the following Prior Art Examples 2 through 4, an explanation will be given of methods for carrying out chemical etching on the polished rear face and dicing cut face of the semiconductor wafer.

[Prior Art Example 2]

Referring to FIG. 13, an explanation will be given of a method for chemically etching the rear polished face of the semiconductor wafer disclosed in Japanese Laid-Open Patent Application No. 201805/1995 (Tokukaihei 7-201805 (published on Aug. 4, 1995).

The front face (element formation face) of the semiconductor wafer 103 having the polished rear face is covered with a protection film 108 (for example, a rubber tape, etc.), and this is attached to a securing base 109 that is freely rotated by a rotation axis 110, with the rear face of the semiconductor wafer 103 facing up. While the wafer securing base 109 is being rotated at a high speed, etchant (for example, a hydrogen fluoride etchant in the case of a semiconductor 103 of Si series) is discharged from an etchant spouting nozzle 111 onto the rear face of the semiconductor wafer 103 that faces up, and at the same time, a cooling fluid (for example, pure water or nitrogen gas), which is inert to the etching reaction, is discharged through a cooling fluid spouting nozzle 112 onto the front face of the semiconductor wafer 103 that faces down; thus, the chemical etching process for eliminating stress resulting from polishing is carried out.

[Prior Art Example 3]

Referring to FIGS. 14(a) through 14(d), an explanation will be given of a method for chemically etching the dicing cut face disclosed in Japanese Laid-Open Patent Application No. 161665/1995 (Tokukaihei 7-161665, published Jun. 23, 1995).

First, a novolak resin is dropped onto the front face of a semiconductor wafer 103 and this is rotated so as to form a protective film 113 (FIG. 14(a)). Next, a dicing sheet (dicing tape 106) is affixed to the front face (element formation face) of the semiconductor wafer 103, and a dicing process is carried out by using a blade so as to divide it into semiconductor chips 107 (FIG. 14(b)). The semiconductor chips 107 thus cut off are immersed into an etchant 114 of a sulfuric-acid type, an ammonia type, etc. so that a machining-affected layer on the cut face 107a is removed (FIG. 14(c)). Thereafter, the semiconductor chips 107 are immersed and washed in a solvent 115 such as acetone so that the protective layer 113 formed on the front face of the semiconductor chip 107 is removed (FIG. 14(c)).

[Prior Art Example 4]

Referring to FIG. 15 and FIG. 16(a) to FIG. 16(f), an explanation will be given of a method for carrying out a rear-face polishing process by chemical etching after a dicing process, which is disclosed in Japanese Laid-Open Patent Application No. 117445/1988 (Tokukaishou 63-117445, published May 21, 1988).

After completion of an IC formation process (S111, FIG. 16(a)), a bump 116 is formed by means of electrolytic plating through a bumping process on each IC of the semiconductor wafer 101 prior to polishing (S112, FIG. 16(b)). Next, a groove having a predetermined depth is formed along ICs from the front face (element formation face) by a dicing process (S113, FIG. 16(c)). Successively, after a wax applying process in which the front face of the semiconductor wafer 101 is coated with wax 117 having chemical etching resistance (S114, FIG. 16(d)), the semiconductor wafer 101 is immersed in a chemical etchant 118 in an etching process so that the rear face thereof is etched so as to have a predetermined thickness (S115, FIG. 16(e)). Then, the semiconductor wafer 103 is washed by water so as to wash the chemical etchant 118 away, and the wax 117 is removed by a solvent. Thereafter, the semiconductor wafer 103 is subjected to a breaking process so as to separate it into semiconductor chips 107 (S116, FIG. 16(f)).

[Prior Art Example 5]

Referring to FIG. 17(a) to FIG. 17(e), an explanation will be given of a manufacturing method for semiconductor chins disclosed in Japanese Examined Patent Publication No. 2737859/1998 (published on Jan. 16, 1998).

First, a semiconductor wafer 101 having a wafer surface pattern formed thereon is checked to see its characteristics (FIG. 17(a)). Then, the wafer 101 is subjected to a semi-full dicing process so as to form the shape of individual chips thereon with a portion x corresponding to approximately half the thickness left from the wafer element formation face (FIG. 17(b)). Thereafter, stains and water adhering to the wafer 101 are removed. Next, a base film 122 is affixed thereon with a bonding agent 121 so as to secure the chips during a rear-face polishing process on the next step (FIG. 17(c)). Moreover, a fixing jig 123 is placed on the periphery of the wafer 101. Then, the wafer 101 is polished from the rear face side up to a predetermined amount so as to separate it into individual chips 107 (FIG. 17(d)). Thereafter, stains and water adhering to the wafer 101 are removed.

Next, the chips 107, bonded to the base film 122, are pushed from the base film 122 side by a pushing jig 124 so that they are allowed to adhere to a joining material 126 that adheres to a die pad 125 shifting in the arrow direction; thus, the chips 107 are separated from the base film 122 by using the adhesive strength of the joining material 126, with the result that the chips 107 are transported while being bonded to the die pad 125 (FIG. 17(e)).

In the methods shown in the Prior Art Examples 1 and 2, it has been generally known that since a machining-affected layer appears on the rear face at the time of polishing the semiconductor wafer 101, a stress is exerted, resulting in problems in the semiconductor wafer 103 after having been subjected to rear-face polishing.

This phenomenon becomes more conspicuous as the semiconductor wafer 101 is made thinner (for example, not more than 200 $\mu$m in the case of a chip card), and deflection, exerted in the semiconductor wafer 103 after polishing the rear face, becomes greater. The resulting problem is that since it becomes difficult to transport or secure the semiconductor wafer 103, it might be easily broken. Here, in order to miniaturize semiconductor devices in which semiconductor chips 107 are assembled, there are demands for reducing the thickness of a semiconductor wafer 103 to not more than 200 $\mu$m.

In this respect, in Prior Art Example 1, after the polishing process of the semiconductor wafer 101, until having been divided into individual pieces of semiconductor chips 107 through the dicing process, since the semiconductor wafer 103 is reinforced by either the protection and reinforcing tape 102 or the dicing tape 106, it is possible to reduce the possibility of the semiconductor wafer 103 being damaged during the handling and transportation process.

However, in the dicing process thereafter, since cracks might occur in the cut face 107a, the strength per unit area of the semiconductor chip 107 decreases. Moreover, in the case of the thickness of the semiconductor wafer 103 not more than 200 $\mu$m, chipping (cracks not bridging from the front face to the rear face) and cracks (those bridging from the front face to the rear face) tend to occur in the rear face of the semiconductor wafer 103 during the dicing process, and in the case of the semi-full dicing, chipping to the rear face and cracks occur at the time of breaking, resulting in the possibility that the wafer might be easily damaged in the following processes.

Moreover, in Prior Art Example 2, defective areas having a machining affected layer and fine cracks that occur at the time of rear-face polishing are removed by chemical etching. However, the problems of fine cracks in the cut face, a machining-affected layer, chipping and cracking at the time of the dicing process thereafter still remain in the same manner as Prior Art Example 1.

Furthermore, in Prior Art Example 3, defective areas having a machining-affected layer and fine cracks that occur at the time of dicing are removed by chemical etching. However, since the processes after the dicing are carried out for each piece of the semiconductor chip 107, problems arise with working efficiency at the time of mass production. Here, even if Prior Art Example 2 and Prior Art Example 3 are combined, problems still arise with working efficiency since the processes after the dicing are carried out for each piece of the semiconductor chip 107.

Moreover, in the above-mentioned Prior Art Example 4, chipping and cracks tend to occur due to breaking after washing, and since the cut face 107a, subjected to the semi-full dicing, is coated with wax 117, it is not possible to carry out chemical etching on the cut face 107a after the dicing process, resulting in problems of fine cracks in the cut face, a machining-affected layer and chipping and cracking. In addition, in Prior Art Example 4, a removing process for wax 117 is required, and the process after removal of the wax 117 has to be carried out on each piece of the semiconductor chips 107; therefore, a problem arises with working efficiency.

Furthermore, in the above-mentioned Prior Art Example 5, since damaged areas such as a machining-affected layer and fine cracks resulted from the dicing process and the rear-face polishing process are not removed, chip cracks and chipping or chip deflection due to an unwanted stress tend to occur, resulting in damages to the semiconductor wafer in the following steps.

SUMMARY OF THE INVENTION

The objective of the present invention is to provide a manufacturing method for a semiconductor device which can carry out a polishing process and a dicing process safely without damaging the semiconductor wafer, without causing cracks, and without chipping.

In order to achieve the above-mentioned objective, the manufacturing method for a semiconductor device of the present invention comprises the steps of:

semi-full dicing a semiconductor wafer so as to leave a dicing residual portion with a predetermined thickness between devices on the semiconductor wafer;

forming a protective layer (film) having a chemical etching resistant property on the element formation face of the semiconductor wafer;

chemically etching the semiconductor wafer having the protective layer formed on the element formation face from the rear face side so as to polish the rear face of the semiconductor wafer, so as to remove the dicing residual portion to divide the semiconductor wafer into individual semiconductor chips, and so as to remove defective areas occurring in the cut face of the semiconductor wafer due to the semi-full dicing process.

With the above-mentioned method, the chemical etching makes it possible to simultaneously carry out the rear-face polishing process of the semiconductor wafer, the dividing process to each piece of the semiconductor chips and the removing process of defective areas such as, a machining-affected layer and chipping and cracking in the cut face of the semiconductor chip due to the semi-full dicing process.

Therefore, it is possible to eliminate the breaking process after the semi-full dicing process that has been conventially required, to reduce the number of processes, and also to prevent cracks and chips that used to occur at the time of breaking. Thus, it becomes possible to carry out a polishing process and a dicing process safely without damaging the semiconductor wafer, without causing cracks and chips.

Moreover, in order to achieve the above-mentioned objective, the manufacturing method for a semiconductor device of the present invention is arranged so that in the above-mentioned semi-full dicing process, the semiconductor wafer is subjected to semi-full dicing from the element formation face so as to leave a dicing residual portion with a predetermined thickness on the rear face side that is the face opposite to the element formation face of the semiconductor wafer, and then, in the above-mentioned protective layer forming process, a protective layer having a chemical etching resistant property is formed on the element formation face of the semiconductor wafer.

With the above-mentioned method, after the semi-full dicing process from the element formation face (front face), the semiconductor wafer having the protective layer formed on the element formation face is subjected to a chemical etching process with the element formation face being protected by the protective layer, so as to simultaneously carry out the rear-face polishing process of the semiconductor wafer, the dividing process to each piece of the semiconductor chips and the removing process of defective areas such as, a machining-affected layer and cracks and chips in the cut face of the semiconductor chip due to the semi-full dicing process.

In other words, in the chemical etching process of the above-mentioned method, first, the semiconductor wafer is etched in the thickness direction of the semiconductor chip from the rear face. In this case, since the dicing residual portion is also simultaneously etched from the rear face, when the etching has reached the thickness (dicing left amount) of the dicing residual portion, the semiconductor wafer is separated into individual pieces of semiconductor chips. After the separation to the semiconductor chips, etchant enters a groove between the adjacent semiconductor chips formed in the semi-full dicing process so that each of the semiconductor chips is subjected to etching also in the width direction from the cut face; thus, it becomes possible to remove the defective areas caused by the semi-full dicing process.

Moreover, in order to achieve the above-mentioned objective, the manufacturing method for a semiconductor device of the present invention is arranged so that, after forming the protective layer having dicing protective and chemical etching resistant properties on the element formation face of the semiconductor wafer in the above-mentioned protective layer forming process, the semiconductor wafer is subjected to semi-full dicing from the rear face that is the face opposite to the element formation face so as to leave a dicing residual portion with a predetermined thickness on the element formation face of the semiconductor wafer in the semi-full dicing process.

In the above-mentioned method, after forming the protective layer on the element formation face, the semiconductor wafer, after having undergone the semi-full dicing from the rear face, is subjected to a chemical etching process with the element formation face being protected by the protective layer, so as to simultaneously carry out the rear-face polishing process of the semiconductor wafer, the dividing process to each piece of the semiconductor chips and the removing process of defective areas such as, a machining-affected layer and cracks and chips in the cut face of the semiconductor chip due to the semi-full dicing process.

In other words, in the chemical etching process of the above-mentioned method, first, the semiconductor wafer is etched in the thickness direction of the semiconductor chip from the rear face. Simultaneously with this process, since etchant enters a groove between the adjacent semiconductor chips formed in the semi-full dicing process, the dicing residual portion is etched from the rear face side, with the result that when the etching has progressed to the dicing residual amount and reached the element formation face of the semiconductor wafer, the semiconductor wafer is divided into semiconductor chips. Moreover, simultaneously with this process, each of the semiconductor chips is subjected to etching also in the width direction from the cut face; thus, it becomes possible to remove the defective areas caused by the semi-full dicing process.

In addition, in the above-mentioned method, the semi-full dicing process is carried out from the rear face, it is possible to eliminate an exchanging process for the dicing protective tapes on the semiconductor wafer, to reduce the number of processes, and consequently to prevent damages, etc., to the semiconductor element due to mishandling, etc. during shifting processes between processes.

For a fuller understanding of the nature and advantages of the invention, reference should be made to the ensuing detailed description taken in conjunction with the accompanying drawings.

BRIEF DESCRIPTION OF THE DRAWINGS

FIG. 11 is a process flow chart that shows a rear-face polishing process and a dicing process of a semiconductor wafer in a conventional manufacturing method of a semiconductor device.

FIG. 12(a) is an explanatory drawing that shows a state in which the semiconductor wafer is processed during the rear-face polishing process and the dicing process in accordance with the process flow chart in the manufacturing method of the semiconductor device shown in FIG. 11.

FIG. 12(b) is an explanatory drawing that shows a state in which the semiconductor wafer is processed during the rear-face polishing process and the dicing process in accordance with the process flow chart in the manufacturing method of the semiconductor device shown in FIG. 11.

FIG. 12(c) is an explanatory drawing that shows a state in which the semiconductor wafer is processed during the rear-face polishing process and the dicing process in accordance with the process flow chart in the manufacturing method of the semiconductor device shown in FIG. 11.

FIG. 12(d) is an explanatory drawing that shows a state in which the semiconductor wafer is processed during the rear-face polishing process and the dicing process in accordance with the process flow chart in the manufacturing method of the semiconductor device shown in FIG. 11.

FIG. 12(e) is an explanatory drawing that shows a state in which the semiconductor wafer is processed during the rear-face polishing process and the dicing process in accordance with the process flow chart in the manufacturing method of the semiconductor device shown in FIG. 11.

FIG. 12(f) is an explanatory drawing that shows a state in which the semiconductor wafer is processed during the rear-face polishing process and the dicing process in accordance with the process flow chart in the manufacturing method of the semiconductor device shown in FIG. 11.

FIG. 12(g) is an explanatory drawing that shows a state in which the semiconductor wafer is processed during the rear-face polishing process and the dicing process in accordance with the process flow chart in the manufacturing method of the semiconductor device shown in FIG. 11.

FIG. 14(a) is an explanatory drawing that shows a state in which the semiconductor wafer is processed during a chemical etching process in still another conventional manufacturing method of the semiconductor device.

FIG. 14(b) is an explanatory drawing that shows a state in which the semiconductor wafer is processed during a chemical etching process in still another conventional manufacturing method of the semiconductor device.

FIG. 14(c) is an explanatory drawing that shows a state in which the semiconductor wafer is processed during a chemical etching process in still another conventional manufacturing method of the semiconductor device.

FIG. 14(d) is an explanatory drawing that shows a state in which the semiconductor wafer is processed during a chemical etching process in still another conventional manufacturing method of the semiconductor device.

FIG. 15 is a process flow chart that shows a rear-face polishing process and a dicing process of a semiconductor wafer in a conventional manufacturing method of a semiconductor device.

FIG. 16(a) is an explanatory drawing that shows a state in which the semiconductor wafer is processed during the rear-face polishing process and the dicing process in accordance with the process flow chart in the manufacturing method of the semiconductor device shown in FIG. 15.

FIG. 16(b) is an explanatory drawing that shows a state in which the semiconductor wafer is processed during the rear-face polishing process and the dicing process in accordance with the process flow chart in the manufacturing method of the semiconductor device shown in FIG. 15.

FIG. 16(c) is an explanatory drawing that shows a state in which the semiconductor wafer is processed during the rear-face polishing process and the dicing process in accordance with the process flow chart in the manufacturing method of the semiconductor device shown in FIG. 15.

FIG. 16(d) is an explanatory drawing that shows a state in which the semiconductor wafer is processed during the rear-face polishing process and the dicing process in accordance with the process flow chart in the manufacturing method of the semiconductor device shown in FIG. 15.

FIG. 16(e) is an explanatory drawing that shows a state in which the semiconductor wafer is processed during the rear-face polishing process and the dicing process in accordance with the process flow chart in the manufacturing method of the semiconductor device shown in FIG. 15.

FIG. 16(f) is an explanatory drawing that shows a state in which the semiconductor wafer is processed during the rear-face polishing process and the dicing process in accordance with the process flow chart in the manufacturing method of the semiconductor device shown in FIG. 15.

FIGS. 17(a) through 17(e) are explanatory drawings that show processes in which a rear-face polishing process is carried out in another conventional manufacturing method of a semiconductor device.

DESCRIPTION OF THE EMBODIMENTS

Embodiment 1

Referring to FIGS. 1 through 6, the following description will discuss one embodiment of the present invention.

The manufacturing method a semiconductor device in accordance with the present embodiment is a method in which, after a semi-full dicing process has been carried out from the front face (elements formation face) bearing semiconductor elements of a disk-shaped semiconductor wafer, processes such as a rear-face polishing process, a dividing process to each piece of chips and a removing process of a damaged layer (defective areas) such as, a machining-affected layer and fine cracks, caused by the semi-full dicing process, are simultaneously carried out.

Figure 1:
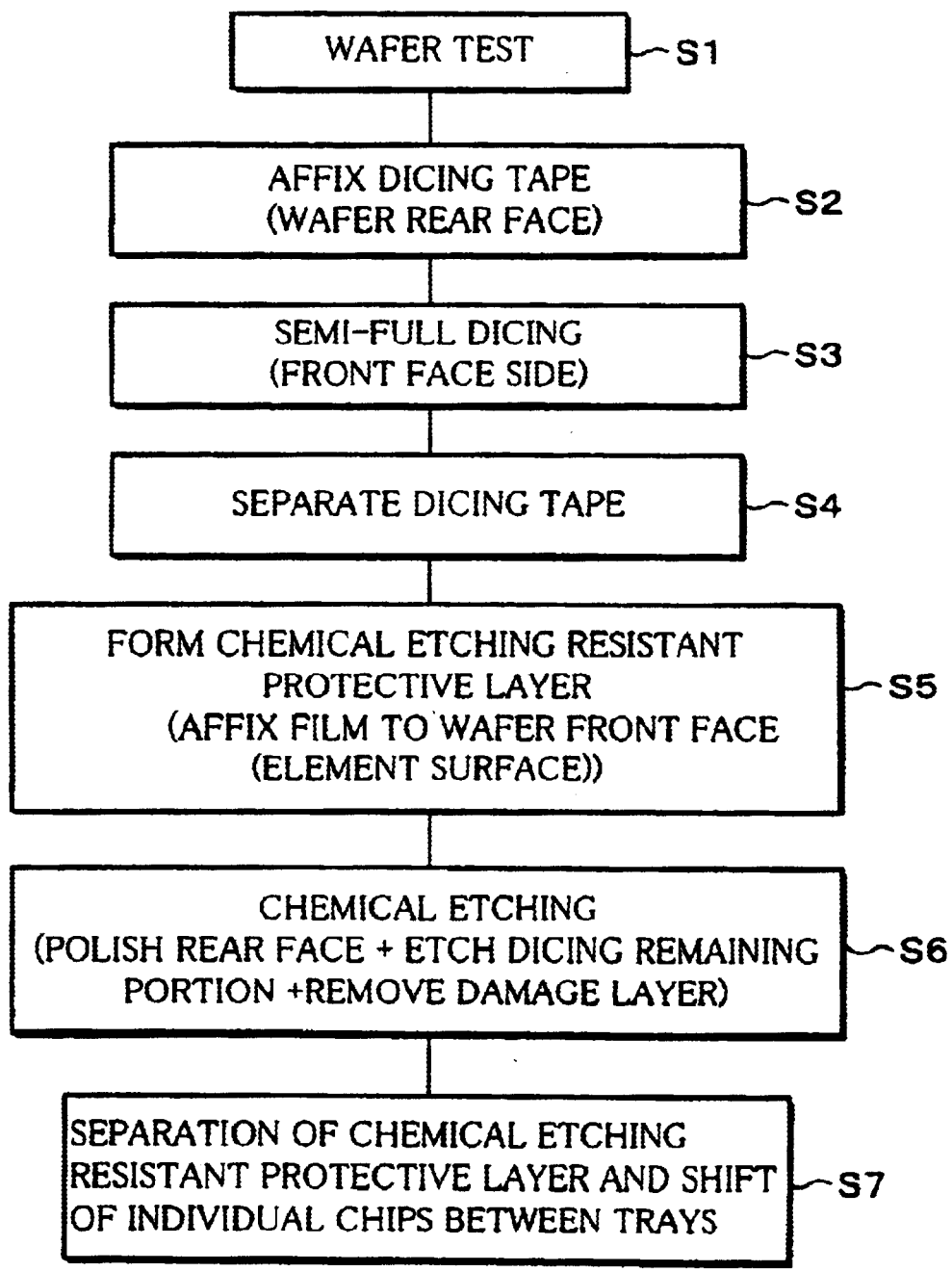
FIG. 1 is a process flow chart that shows a rear-face polishing process and a dicing process of a semiconductor wafer in a manufacturing method of a semiconductor device in accordance with one embodiment of the present invention.
Figure 2:
FIG. 2(a) is an explanatory drawing that shows a state in which the semiconductor wafer is processed during the rear-face polishing process and the dicing process in accordance with the process flow chart in the manufacturing method of the semiconductor shown in FIG. 1.
FIG. 2(b) is an explanatory drawing that shows a state in which the semiconductor wafer is processed during the rear-face polishing process and the dicing process in accordance with the process flow chart in the manufacturing method of the semiconductor device shown in FIG. 1.
FIG. 2(c) is an explanatory drawing that shows a state in which the semiconductor wafer is processed during the rear-face polishing process and the dicing process in accordance with the process flow chart in the manufacturing method of the semiconductor device shown in FIG. 1.
FIG. 2(d) is an explanatory drawing that shows a state in which the semiconductor wafer is processed during the rear-face polishing process and the dicing process in accordance with the process flow chart in the manufacturing method of the semiconductor device shown in FIG. 1
FIG. 2(e) is an explanatory drawing that shows a state in which the semiconductor wafer is processed during the tear-face polishing process and the dicing process in accordance with the process flow chart in the manufacturing method of the semiconductor device shown in FIG. 1.
FIG. 2(f) is an explanatory drawing that shows a state in which the semiconductor wafer is processed during the rear-face polishing process and the dicing process in accordance with the process flow chart in the manufacturing method of the semiconductor device shown in FIG. 1.
FIG. 2(g) is an explanatory drawing that shows a state in which the semiconductor wafer is processed during the rear-face polishing process and the dicing process in accordance with the process flow chart in the manufacturing method of the semiconductor device shown in FIG. 1.
Figure 2:
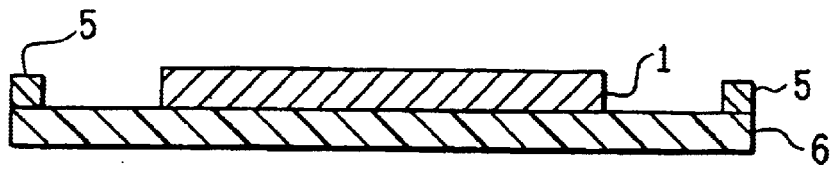
Figure 2:
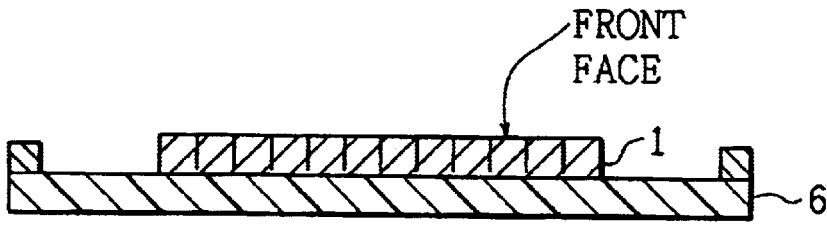
Figure 2:
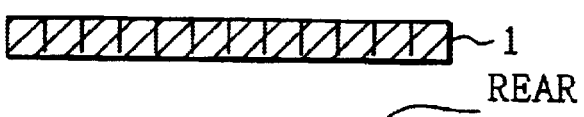
Figure 2:
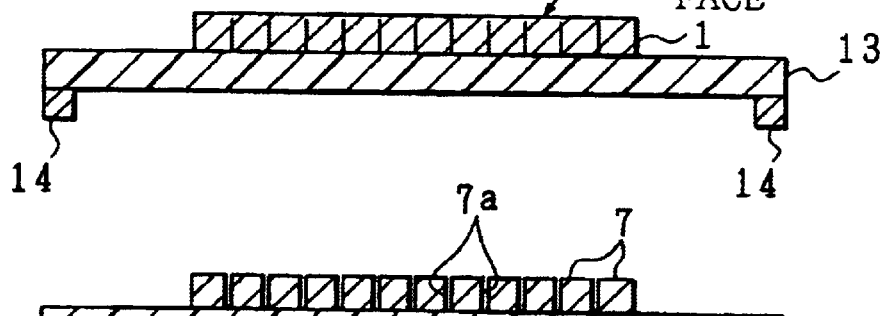
Figure 2:
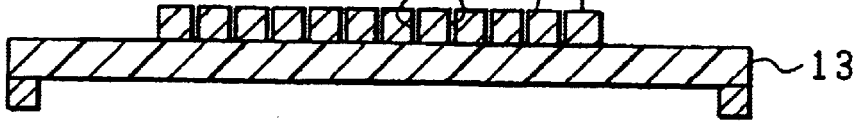
Figure 2:
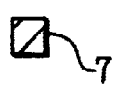

Referring to FIG. 1 ad FIG. 2, an explanation will be given of processes from the dicing process to the polishing process in the manufacturing method of the semiconductor device of the present embodiment.

FIG. 1 is a process flow chart that shows the rear-face polishing process to the dicing process of a semiconductor wafer in the manufacturing method of a semiconductor device in accordance with the present embodiment. FIGS. 2(a) through 2(g) are cross-sectional views that show states in which a semiconductor wafer 1 is processed in accordance with the process flow chart shown in FIG. 1.

As illustrated in FIG. 1, the manufacturing method of a semiconductor device in accordance with the present embodiment includes the following processes:

step S1: wafer test process step S2: dicing tape affixing process step S3: semi-full dicing process step S4: dicing tape separation process step S5: chemical etching resistant protective layer formation process (protective layer formation process)

step S6: chemical etching process step S7: chemical etching resistant protective layer separation process and shifting process of semiconductors between trays (protection layer removing process)

Therefore, the following description will discuss each of the above-mentioned processes following the sequence of the processes.

*From Wafer Test Process to Dicing Tape Separation Process

Since the wafer test process (S1, FIG. 2(a)), the dicing tape affixing process (S2, FIG. 2(b)) and the semi-full dicing process (S3, FIG. 2(c)) are the same as those conventionally carried out, the description thereof is given only briefly.

Upon completion of the wafer test (S1, FIG. 2(a)), the rear face of the semiconductor wafer 1 is affixed to dicing tape 6 (S2, FIG. 2(b)) through a metal carrier frame 5 attached to the peripheral portion of the dicing tape 6 (S2, FIG. 2(b)). In this state, from the front face (element formation face) of the semiconductor 1, a groove is formed to a predetermined depth along the outer shape of the element formed on the front face (semi-full dicing) (S3, FIG. 2(c)). Thus, a dicing residual portion is left on the rear-face side of the semiconductor wafer 1. Here, the conditions of the semi-full dicing are set, for example, at 40000 rpm in the number of revolutions, 80 mm/sec in a transfer speed, and approximately 40 to 60 μm in the thickness (dicing residual amount) of the dicing residual portion.

Thereafter, in the dicing tape separation process (S4, FIG. 2(d)), the semiconductor wafer 1 is placed on a porous stage with its polished face facing down, and then subjected to a vacuum suction process so as to separate the dicing tape 6 placed thereon.

*Chemical Etching Resistant Protective Layer Formation Process

In the chemical etching resistant protective layer Formation process (S5, FIG. 2(e)), a film 13 having a chemical etching resistant property is formed on the front face (element formation face) of the semiconductor wafer 1.

More specifically, as illustrated in FIG. 2(e), a carrier frame (protective layer holding means) 14 (FIG. 3), made of metal or resin with its entire surface coated with fluororesin, is attached to the external portion of the film 13, in a manner so as to surround the perimeter of an area to which the semiconductor wafer 1 is to be affixed. Through this carrier frame 14, the front face (element formation face) of the semiconductor wafer 1 is affixed to the film 13 which has a chemical etching resistant property. Here, with respect to the carrier frame 14, an explanation will be given later.

With respect to the film 13, various film materials, such as those of ultraviolet (UV) separation type, thermal foaming type or adhesive type, having a chemical etching resistant property may be used. With respect to those of the ultraviolet separation type, for example, chemical etching resistant films ((PET) polyethylene terephthalate) or polyolefin) coated with a ultraviolet separation type bonding agent having a chemical etching resistant property are listed. With respect to those of the thermal foaming type, chemical etching resistant films (PET) coated with a thermal foaming type bonding agent having a chemical etching resistant property are listed. With respect to those of the adhesive type, chemical etching resistant films (polyethylene) coated with an adhesive type bonding agent having a chemical etching resistant property are listed. Here, as for the bonding agent, a chemical etching resistant material such as fluorine is preferably used.

Moreover, in order to prevent penetration of etchant from the bonding faces of the front face of the semiconductor wafer 1, the bonding agent for bonding the film 13 may also have a chemical etching resistant property. Furthermore, at the time of affixing the film 13 onto the semiconductor wafer 1, provision is made so as not to let bubbles enter between the surface of the semiconductor wafer 1 and the film 13. This is because, if there are any bubbles between the semiconductor wafer 1 and the surface of the film 13, the front face (element formation face) of the semiconductor wafer 1 might be etched during a chemical etching process.

*Chemical Etching Process

In the chemical etching process (S6, FIG. 2(f)), with the front face of the semiconductor wafer 1 (element formation face) being protected by the film 13, a damaged area on a cut face 7a of a semiconductor chip 7 resulting from a semi-full dicing process (S3, FIG. 2(c)) is removed by the chemical etching process, and the rear-face polishing process of the semiconductor wafer 1 and the dividing process thereof into individual semiconductor chips 7 are also carried out.

In other words, the semiconductor wafer 1, affixed onto the film 13 secured to the carrier frame 14, is immersed into, for example, a hydro-fluoric acid based etchant at a normal temperature of 25° C. Thus, while the front face (element formation face) is being protected by the film 13, the semiconductor wafer 1 is chemically etched so that it becomes possible to simultaneously carry out the rear-face polishing process of the semiconductor wafer 1, the dividing process into individual semiconductor chips 7 and the removing process of a damaged layer, such as a machining-affected layer and cracks, in the cut face 7a of the semiconductor chip 7 due to the semi-full dicing process.

In the etchant, first, the semiconductor wafer 1 is etched from the rear face of the semiconductor chip 7 in the thickness direction. In this case, the dicing residual portion is simultaneously etched from the rear face so that when the etching has reached the dicing residual amount of the semi-full dicing process, the semiconductor wafer 1 is separated into semiconductor chips 7. Then, after the separation into the semiconductor chips 7, the etchant enters a groove between the adjacent semiconductor chips 7, with the result that the conductor chip 7 is also etched in the width direction from the cut surface 7a; thus, the damaged layer (defective areas) resulting from the semi-full dicing process is also removed. Here, the application of a bonding agent having a chemical etching resistant property in joining the semiconductor wafer 1 to the film 13 makes it possible to prevent the etchant from entering the bonding face of the semiconductor wafer 1 and from etching the front face (element formation face).

Here, since the rate of the chemical etching is approximately 3 to 4 μm/minute, the damaged layer (defective areas) such as a machining-affected layer can be removed in approximately 1 to 1.5 minutes. Therefore, the chemical etching process, including the time required for etching for dividing into the semiconductor chips 7 (where the thickness of the dicing residual portion (dicing residual amount) is set to approximately 40 to 60 μm), is complete in approximately 20 minutes.

*Separation of the Protective Layer Having a Chemical Etching Resistant Property and Shifting Processes Between Trays In the separation of the protective layer having a chemical etching resistant property and the shifting processes between trays (S7, FIG. 2(g)), the film 13 is removed and the individual semiconductor chips 7 are shifted to trays.

In other words, after the chemical etching process (S6, FIG. 2(f)), this is washed with pure water so as to wash the chemical etchant away, and subjected to a process for reducing the bonding strength of the film 13. Thereafter, the semiconductor chips 7 are picked up one by one by using a suction collet from the rear face and these are shifted to trays for individual chips.

In the case when the film 13 is a chemical etching resistant film of a ultraviolet separation type, ultraviolet rays having an intensity of 200 to 300 mJ/cm$^2$ are directed to the semiconductor chips 7 from the front face thereof for 2 to 3 seconds so as to reduce the bonding strength of the film 13. In the case when the film 13 is a chemical etching resistant film of a thermal foaming type, the semiconductor chips 7 are transported to a stage having a thermal heater function, and secured thereto with the film 13 that is a thermal foaming tape facing down, and this is heated at 120° C. for 30 seconds so as to reduce the adhesive strength of the film 13. Here, in the case when the film 13 is a chemical etching resistant film of a sticking type, since the adhesive strength is set so that only one of the semiconductor chips 7 is picked up by using the suction collet from rear face and shifted to a tray, it is not necessary to reduce the adhesive strength.

Next, an explanation will be given of a device used for the above-mentioned chemical etching process.

In the above-mentioned chemical etching process (S6, FIG. 2(f)), the semiconductor wafer 1 is immersed in an etchant so as to be chemically etched. In this case, with respect to a carrier frame 14 to which the film 13 is bonded, those having a ring shape with a flat bonding face for the film 13, made of metal or resin with its entire surface being covered with fluororesin coat having a chemical etching resistant property as illustrated in FIGS. 3(a) and 3(b) may be adopted. The outer shape of the carrier frame 14 is designed so that a position securing notched portion is desirably formed therein depending on the devices.

Moreover, in the chemical etching process, instead of the immersing process to the etchant, the etchant may be discharged onto the semiconductor wafer 1 as in the case of the aforementioned prior art 2.

Figure 5:
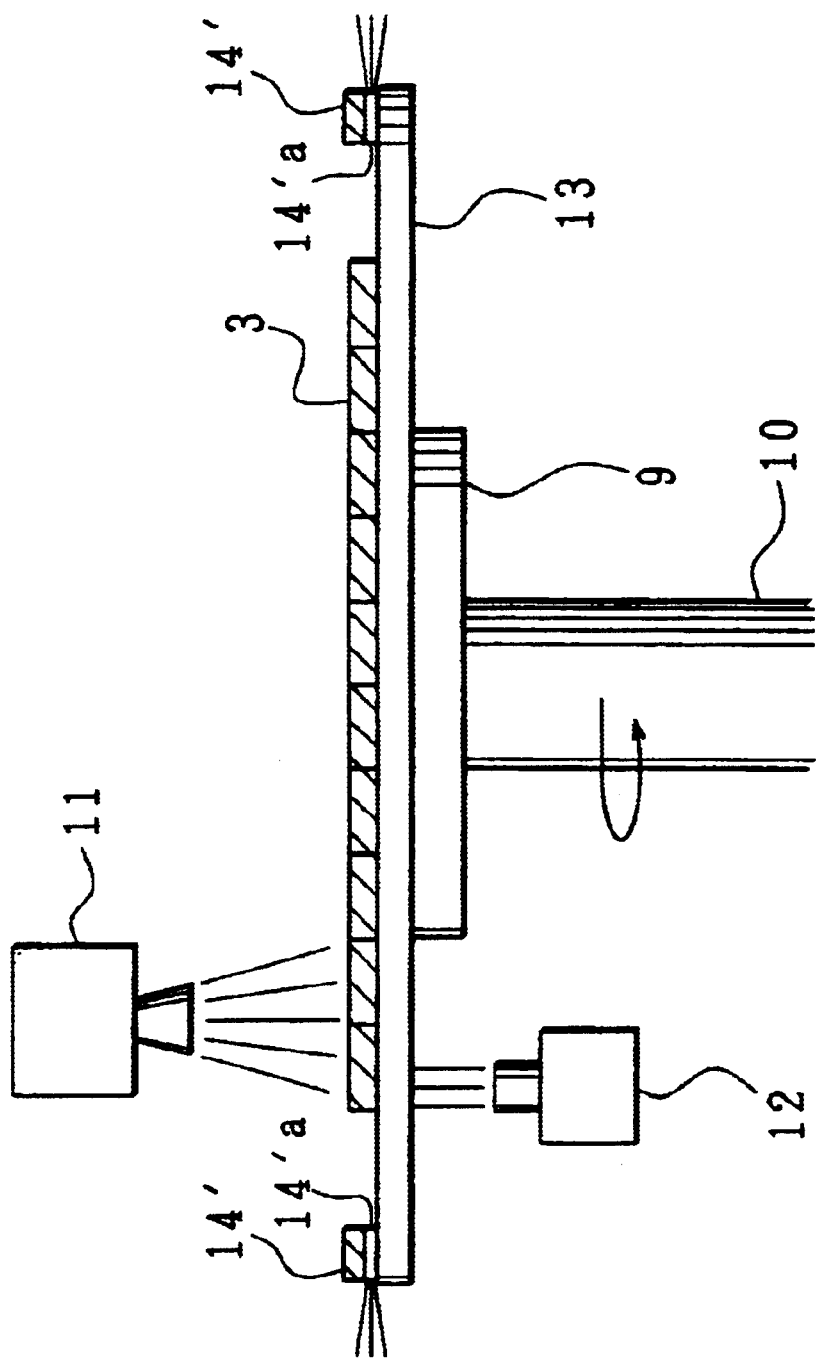
FIG. 5 is an explanatory drawing that shows a state in which the carrier frame shown in FIGS. 4(a) and 4(b) is attached to a chemical etching device.

More specifically, as illustrated in FIG. 5, a semiconductor wafer 3, which has been subjected to a rear-face polishing process and affixed onto the front face of a film 13, is attached to a wafer fixing base 9 that is allowed to freely rotate on a rotary axis 10 with its rear face facing an etching spouting nozzle 11 located above. Then, with the wafer fixing base 9 being rotated at a high speed, an etchant is discharged onto the rear face of the semiconductor wafer 3 that faces up through the etchant spouting nozzle 11 while a cooling fluid (for example, pure water or nitrogen gas) that is inert to the etching reaction is discharged on the front face (element formation face) of the semiconductor wafer 3 that faces down, through a fluid spouting nozzle 12.

Here, in FIG. 5, a carrier frame (protective layer holding means) 14', made of metal or resin, the entire surface of which is fluororesin coated so as to impart a chemical etching resistant property, is affixed to the same face of the film 13 on which the semiconductor wafer 3 has been affixed. In this case, when the etchant resides inside the carrier frame 14' on the film 13 at the time of the chemical etching process, it is highly possible that a reduction in the etching rate or deviations in the rate depending on places might occur. For this reason, as illustrated in FIGS. 4(a) and 4(b), grooves (draining means) 14'a, having a radial shape, are formed in the carrier frame 14' on its affixing face to the film 13 so as to discharge the residual etchant on the film 13. Moreover, the outer shape of the carrier frame 14 is designed so that a position securing notched portion is desirably formed therein depending on the devices.

Figure 6:
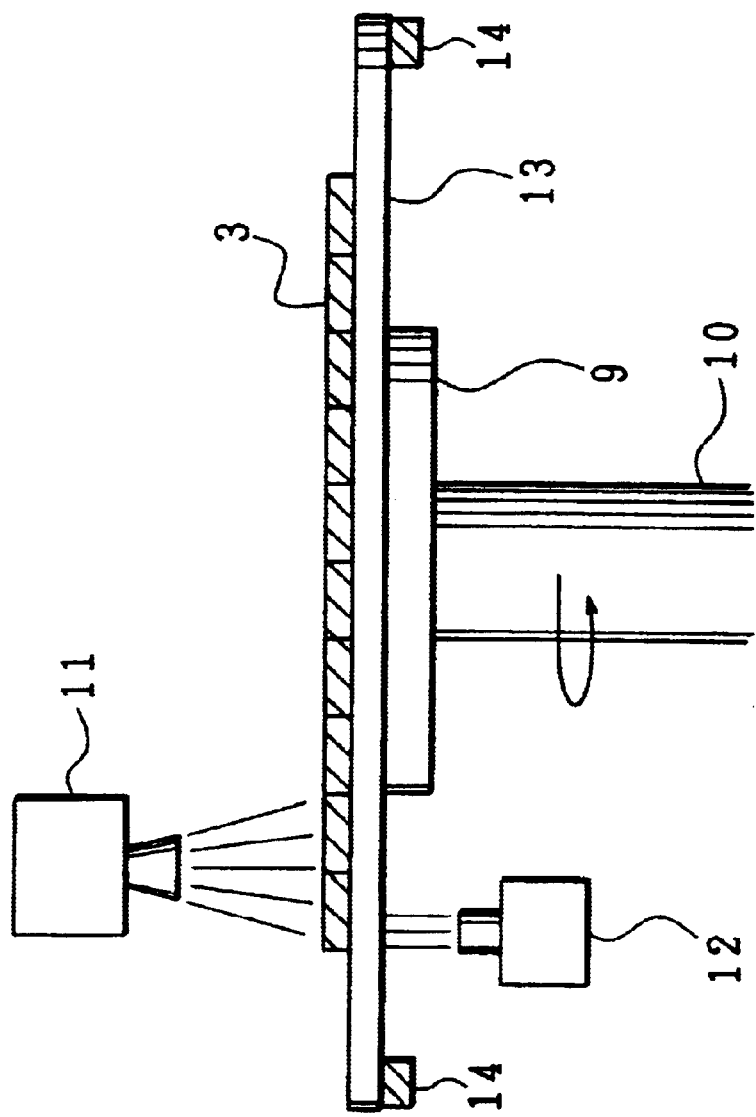
FIG. 6 is an explanatory drawing that shows a state in which the carrier frame shown in FIGS. 3(a) and 3(b) is attached to a chemical etching device.

In contrast, as illustrated in FIG. 6, the carrier frame 14 may be affixed to the face of the film 13 opposite to the face to which the semiconductor wafer 3 has been affixed. In this case, since no etchant resides on the film 13 at the time of the chemical etching process, it is possible to use the carrier frame 14 without the need for providing a draining outlet such as the grooves 14'a of the carrier frame 14'.

As described above, even in the case of the application of the device shown in FIG. 5 or FIG. 6, by using the chemical etching process, a damaged layer (defective areas) on the rear face of the semiconductor wafer 3 caused by the polishing process and a damaged layer (defective areas) such as a machining-affected layer and fine cracks in the chip cut face caused by the semi-full dicing process, can be removed while the front face (element formation face) of the semiconductor wafer 3 is being protected, and simultaneously with these processes, the rear-face polishing process of the semiconductor wafer 3 and the separation to individual chips from the semi-full dicing state through the removal of the dicing residual portion can be carried out at the same time.

Additionally, the above description exemplified a semiconductor wafer 3 after having been subjected to the rear-face polishing process; however, instead of the semiconductor wafer 3, the semiconductor wafer 1 prior to the rear-face polishing process may be attached so as to be subjected to the chemical etching-process.

Figure 3:
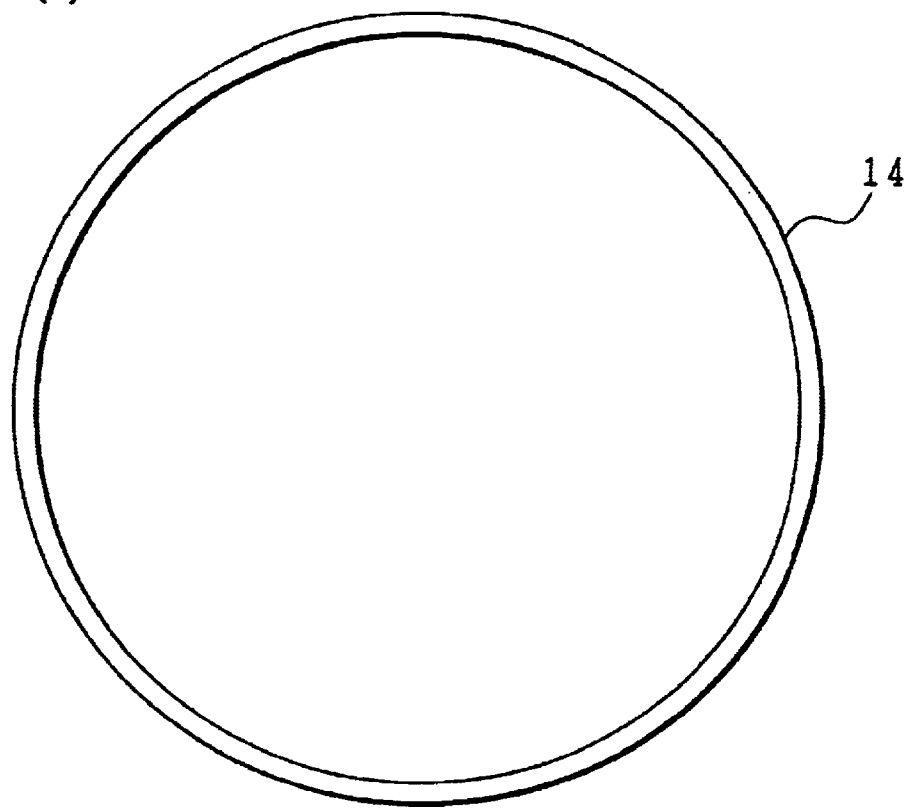
FIG. 3(a) is a plan view of a carrier frame used in the rear-face polishing process and the dicing process in the manufacturing method of the semiconductor device shown in FIG. 1.
FIG. 3(b) is a side view of the carrier frame used in the rear-face polishing process and the dicing process in the manufacturing method of the semiconductor device shown in FIG. 1.
Figure 3:
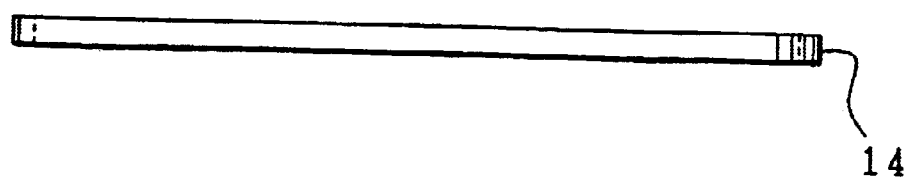
Figure 4:
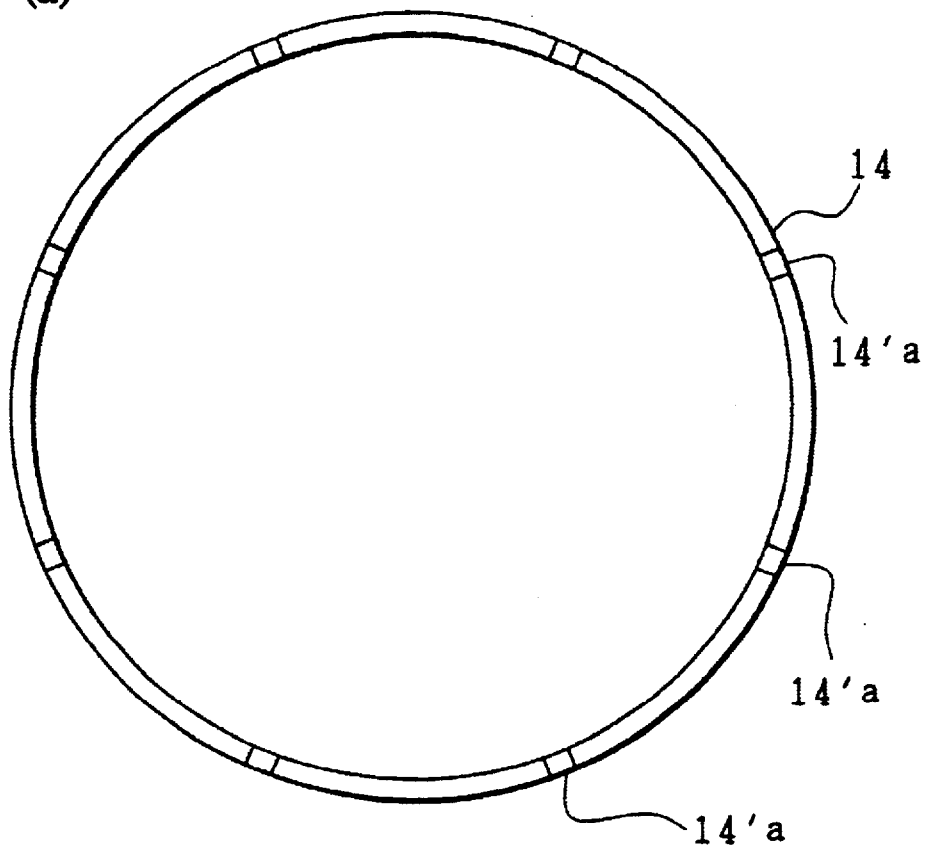
FIG. 4(a) is a plan view of another carrier frame used in the rear-face polishing process and the dicing process in the manufacturing method of the semiconductor device shown in FIG. 1.
FIG. 4(b) is a side view of another carrier frame used in the rear-face polishing process and the dicing process in the manufacturing method of the semiconductor device shown in FIG. 1.
Figure 4:
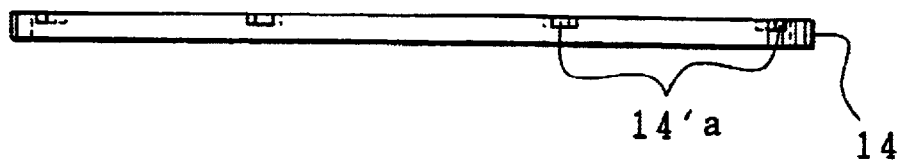

Moreover, in FIG. 3 or FIG. 4, the carrier frame 14, 14' is attached to the periphery of the frame 13 in a manner so as to surround the entire circumference of the semiconductor wafer 1. Here, the entire circumference of the semiconductor wafer 1 refers to an entire circumferential side face with respect to the center axis in the thickness direction of a disk-shaped semiconductor wafer 1. However, with respect to the carrier frame 14, 14', any shape may be adopted as long as it can hold the film 13 with a uniform tension, and it is not limited by the shape shown in FIG. 3 or FIG. 4. Moreover, the shape and the installation position of the groove 14' is not limited by the one shown in FIG. 4, and can be designed desirably depending on conditions in the manufacturing process.

As described above, with the manufacturing method of the semiconductor device in accordance with the present embodiment, it becomes possible to simultaneously carry out the rear-face polishing process of the semiconductor wafer into the dividing process into individual semiconductor chips 7 and the removing process of a damaged layer, such as a machining-affected layer and cracks, in the cut face 7a of the semiconductor chip 7 due to the semi-full dicing process.

Therefore, since the breaking process after the semi-full dicing process, which used to be required conventionally, is no longer necessary, it becomes possible to reduce the number of processes, and also to avoid chips and cracks that would occur during the breaking process.

Moreover, by adopting a carrier system using a carrier frame 14(14'), the chemical etching can be carried out on the basis of each sheet of the semiconductor wafer 1 or on the basis of one lot including a plurality of sheets thereof; therefore, it is advantageous from the viewpoint of mass production.

Furthermore, the carrier frame 14 (14') holds the film 13 to which the semiconductor chips 7 are bonded with a uniform tension; therefore, it is possible to prevent a reduction in the rigidity in the entire semiconductor wafer 1 which occurs when the semiconductor wafer 1 in a semi-full dicing state is divided into individual semiconductor chips 7 following the progress of the chemical etching. As a result, it becomes possible to prevent deviations in the amount of etching due to residual etchant as well as contact between the divided semiconductor chips 7, caused by deflection in the film 13 occurring at the time of a reduction in the rigidity thereof.

Embodiment 2

Figure 7:
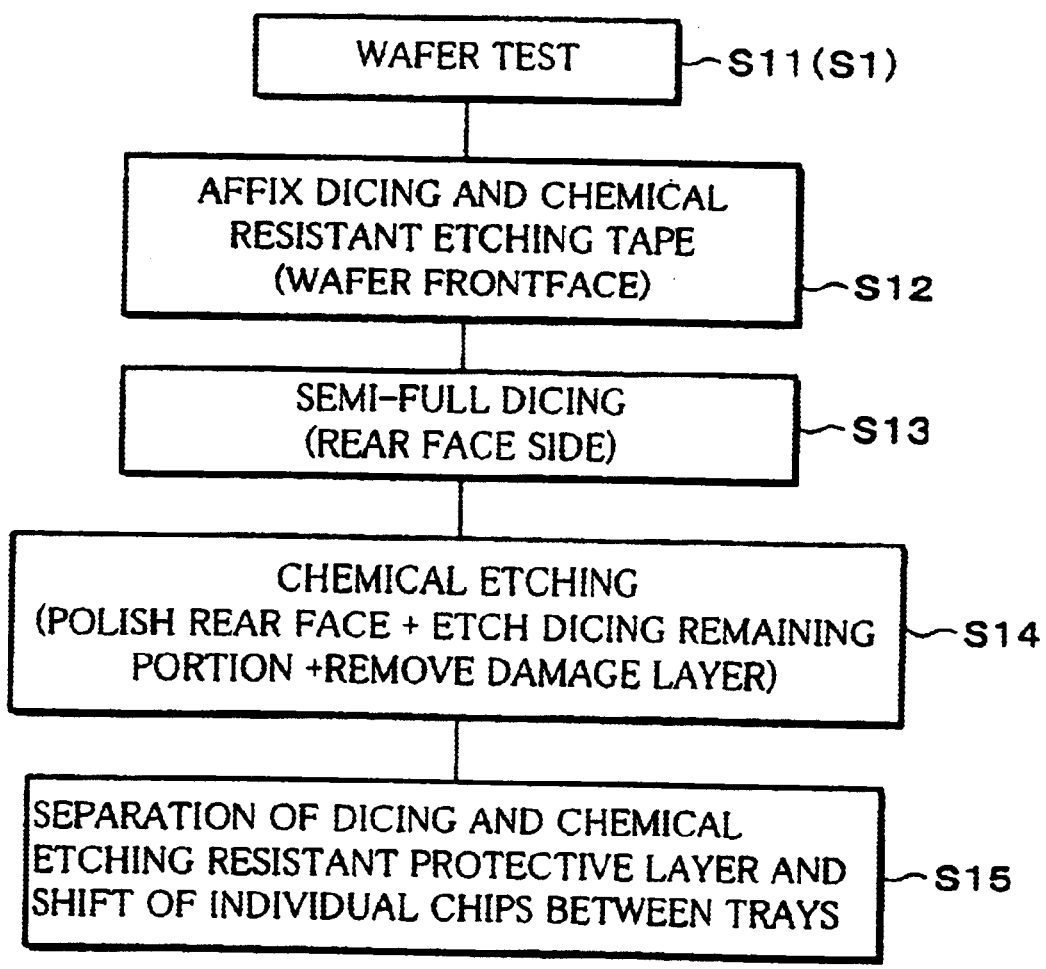
FIG. 7 is a process flow chart that shows a rear-face polishing process and a dicing process of a semiconductor wafer in a manufacturing method of a semiconductor device in accordance with another embodiment of the present invention.
Figure 8:
FIG. 8(a) is an explanatory drawing that shows a state in which the semiconductor wafer is processed during the rear-face polishing process and the dicing process in accordance with the process flow chart in the manufacturing method of the semiconductor device shown in FIG. 7.
FIG. 8(b) is an explanatory drawing that shows a state in which the semiconductor wafer is processed during the rear-face polishing process and the dicing process in accordance with the process flow chart in the manufacturing method of the semiconductor device shown in FIG. 7.
FIG. 8(c) is an explanatory drawing that shows a state in which the semiconductor wafer is processed during the rear-face polishing process and the dicing process in accordance with the process flow chart in the manufacturing method of the semiconductor device shown in FIG. 7.
FIG. 8(d) is an explanatory drawing that shows a state in which the semiconductor wafer is processed during the rear-face polishing process and the dicing process in accordance with the process flow chart in the manufacturing method of the semiconductor device shown in FIG. 7.
FIG. 8(e) is an explanatory drawing that shows a state in which the semiconductor wafer is processed during the rear-face polishing process and the dicing process in accordance with the process flow chart in the manufacturing method of the semiconductor device shown in FIG. 7.
Figure 8:
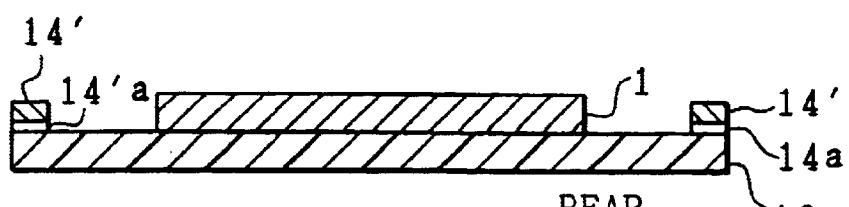
Figure 8:
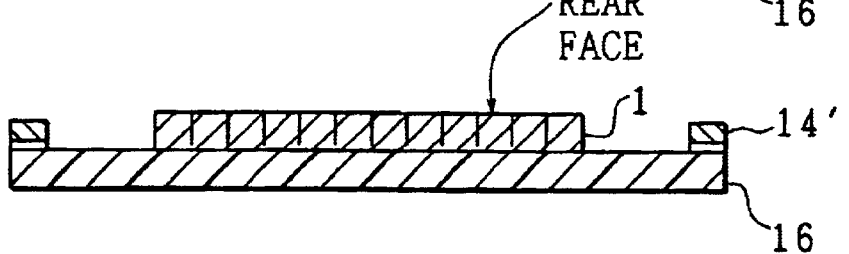
Figure 8:
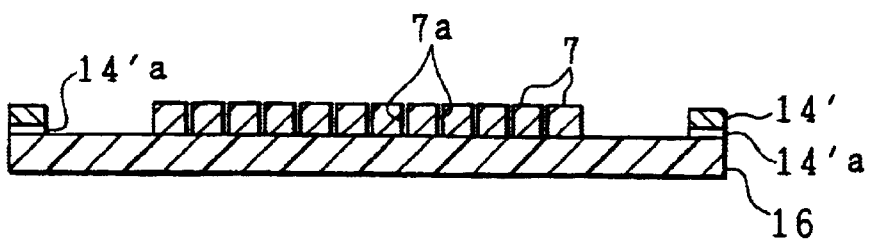
Figure 8:

Referring to FIGS. 7 and 8, the following description will discuss another embodiment of the present invention. Here, for convenient explanation, in the present embodiment, those members that have the same functions and that are described in Embodiment 1 are indicated by the same reference numerals and the description thereof is omitted.

In the manufacturing method of the semiconductor device in accordance with the present embodiment, the semi-full dicing is carried out from the rear face of a semiconductor wafer.

Referring to FIGS. 7 and 8, an explanation will be given of processes from the dicing process to the polishing process in the manufacturing method of the semiconductor device of the present embodiment.

FIG. 7 is a process flow chart that shows processes from the dicing process to the rear-face polishing process of a semiconductor wafer in the manufacturing method of a semiconductor device in accordance with the present embodiment. FIGS. 8(a) through 8(e) are cross-sectional views that show states in which a semiconductor wafer 1 is processed in accordance with the process flow chart shown in FIG. 7.

As illustrated in FIG. 7, the manufacturing method of a semiconductor device in accordance with the present embodiment includes the following processes:

step S11: wafer test process step S12: affixing process for a tape for dicing and for chemical etching resistance (protective layer forming process)

step S13: semi-full dicing process step S14: chemical etching process step S15: separation process for the tape for dicing and for chemical etching resistance and shifting process of semiconductors between trays (protective layer forming process)

Therefore, the following description will discuss each of the above-mentioned processes following the sequence of the processes.

*Wafer Test Process

The wafer test process (S11, FIG. 8(a)) is the same as the wafer test process (S1 of FIG. 1, FIG. 2(a)) of the aforementioned Embodiment 1. In other words, it is the same as the Prior Art 1 (S101 of FIG. 11, FIG. 12(a)).

*Affixing Process for a Tape for Dicing and Chemical Etching Resistance

In the affixing process for a tape for dicing and for chemical etching resistance (S12, FIG. 8(b)), a film 16, which serves as a protective layer (tape) for dicing and chemical etching, is affixed on the front face (element formation face) of a semiconductor wafer 1.

More specifically, as illustrated in FIG. 8(b), a carrier frame 14' (FIG. 4), made of metal or resin with its entire surface coated with fluororesin, is attached to the peripheral portion of the film 16, in a manner so as to surround the perimeter of an area to which the semiconductor wafer 1 is to be affixed, and through this carrier frame 14', the film 16 is affixed to the front face of the semiconductor wafer 1. Here, the front face to which the carrier frame 14' is affixed is the same surface as the semiconductor wafer 1. With respect co the film 16, in the same manner as Embodiment 1, various film materials having a chemical etching resistant property, such as those of ultraviolet separation type, thermal foaming type or adhesive type, may be used.

Moreover, in order to prevent penetration of etchant from the bonding faces between the front face of the semiconductor wafer 1 and the film 16, the bonding agent for bonding the film 16 may also have a chemical etching resistant property. Furthermore, at the time of affixing the film 16 to the semiconductor wafer 1, provision is made so as not to let bubbles enter between the surface of the semiconductor wafer 1 and the film 16. This is because, if there are any bubbles between the semiconductor wafer, the front face (element formation face) of the semiconductor wafer 1 might be etched at the time of a chemical etching process.

Moreover, by using a carrier frame 14' made of metal or resin coated with fluororesin having chemical etching resistance, the chemical etching can be carried out on the basis of each sheet of the semiconductor wafer 1 or on the basis of one lot including a plurality of sheets thereof.

*Semi-full Dicing Process

In the semi-full dicing process (S13, FIG. 8(c)), a semi-full dicing process is carried out from the rear face of the semiconductor wafer 1. Thus, a dicing residual portion is left on the front-face (element formation face) side of the semiconductor wafer 1. Here, the conditions of the semi-full dicing are set, for example, at 40000 rpm in the number of revolutions, 80 mm/sec in a transfer speed, and approximately 40 to 60 $\mu$m in the thickness (dicing residual amount) of the dicing residual portion.

*Chemical Etching Process

In the chemical etching process (S14, FIG. 8(d)), with the front face of the semiconductor wafer 1 (element formation face) being protected by the film 16, a damaged area on a cut face 7a of a semiconductor chip 7 resulting from a semi-full dicing process (S13, FIG. 8(c)) is removed by the chemical etching process, and the rear-face polishing process of the semiconductor wafer 1 and the dividing process thereof into individual semiconductor chips 7 are also carried out.

In other words, the semiconductor wafer 1, affixed onto the film 16 secured to the carrier frame 14', is immersed into, for example, a hydro-fluoric acid based etchant at a normal temperature of 25° C. Thus, while the front face is being protected by the film 16, the semiconductor wafer 1 is chemically etched so that it becomes possible to simultaneously carry out the rear-face polishing process of the semiconductor wafer 1, the dividing process into individual semiconductor chips 7 and the removing process of a damaged layer, such as a machining-affected layer and cracks, in the cut face 7a of the semiconductor chip 7 due to the semi-full dicing process.

In the etchant, first, the semiconductor wafer 1 is etched from the rear face thereof in the thickness direction of the semiconductor chip 7. Simultaneously, since the etchant enters a groove between the adjacent semiconductor chips 7, the dicing residual portion is etched from the rear face so that when the etching has reached the front face (element formation face) of the semiconductor wafer 1 through the dicing residual amount, the semiconductor wafer 1 is separated into semiconductor chips 7. Moreover, at the same time, the semiconductor chip 7 is also etched in the width direction from the cut surface 7a; thus, the damaged layer (defective areas) resulting from the semi-full dicing process is also removed. Here, the application of a bonding agent having a chemical etching resistant property in affixing the semiconductor wafer 1 onto the film 16 makes it possible to prevent the etchant from entering the bonding face of the semiconductor wafer 1 and from etching the front face.

Here, in the case when the same conditions as Embodiment 1 are used, since the rate of the chemical etching is approximately 3 to 4 $\mu$m/minute, the damaged layer (defective areas) such as a machining-affected layer can be removed in approximately 1 to 1.5 minutes. Therefore, the chemical etching process, including the time required for etching for dividing into the semiconductor chips 7 (where the thickness of the dicing residual portion (dicing residual amount) is set to approximately 40 to 60 $\mu$m), is complete in approximately 20 minutes.

As described above, the chemical etching makes it possible to simultaneously carry out the rear-face polishing process of the semiconductor wafer 1, the dividing process into individual semiconductor chips 7 and the removing process of a damaged layer, such as a machining-affected layer and cracks, in the cut face 7a of the semiconductor chip 7 due to the semi-full dicing process.

Therefore, since the breaking process after the semi-full dicing process, which used to be required conventionally, is no longer necessary, it becomes possible to reduce the number of processes, and also to avoid chips and cracks that would occur during the breaking process.

Moreover, by adopting a carrier system using the carrier frame 14', the chemical etching can be carried out on the basis of each sheet of the semiconductor wafer 1 or on the basis of one lot including a plurality of sheets thereof; therefore, it is advantageous from the viewpoint of mass production.

Furthermore, the carrier frame 14' holds the film 16 to which the semiconductor chips 7 are bonded with a uniform tension; therefore, it is possible to prevent a reduction in the rigidity in the entire semiconductor wafer 1 which occurs when the semiconductor wafer 1 in a semi-full dicing state is divided into individual semiconductor chips 7 following the progress of the chemical etching. As a result, it becomes possible to prevent deviations in the amount of etching due to residual etchant as well as contact between the divided semiconductor chips 7, caused by deflection in the film 13 occurring at the time of a reduction in the rigidity thereof.

*Separation Process for the Tape for Dicing and for Chemical Etching Resistance and Shifting Process of Semiconductors Between Trays In the separation process for the tape for dicing and for chemical etching resistance and shifting process of semiconductors between trays (S15, FIG. 8(e)), the film 16 is removed and the individual semiconductor chips 7 are shifted to trays.

In other words, after the chemical etching process (S14, FIG. 8(d)), this is washed with pure water so as to wash the chemical etchant away, and subjected to a process for reducing the bonding strength of the film 16. Thereafter, the semiconductor chips 7 are picked up one by one by using a suction collet from the rear face and these are shifted to trays for individual chips. Here, with respect to the process for reducing the adhesive strength of the film 16, the same process for reducing the adhesive strength of film 13 in Embodiment 1 is used; and optimal processes, such as ultraviolet irradiation or application of heat, can be selected depending on characteristics of the film 16.

As described above, with the manufacturing method of a semiconductor device of the present embodiment, since the protective tape exchanging process of the semiconductor wafer is eliminated, it becomes possible to reduce the number of processes, and since the reinforcing action is exerted by the film 16 from the semi-full dicing to the separation to individual chips 7, it becomes possible to prevent damages such as scratches to the semiconductor element due to mishandling at the time of the exchanging process.

Embodiment 3

Figure 9:
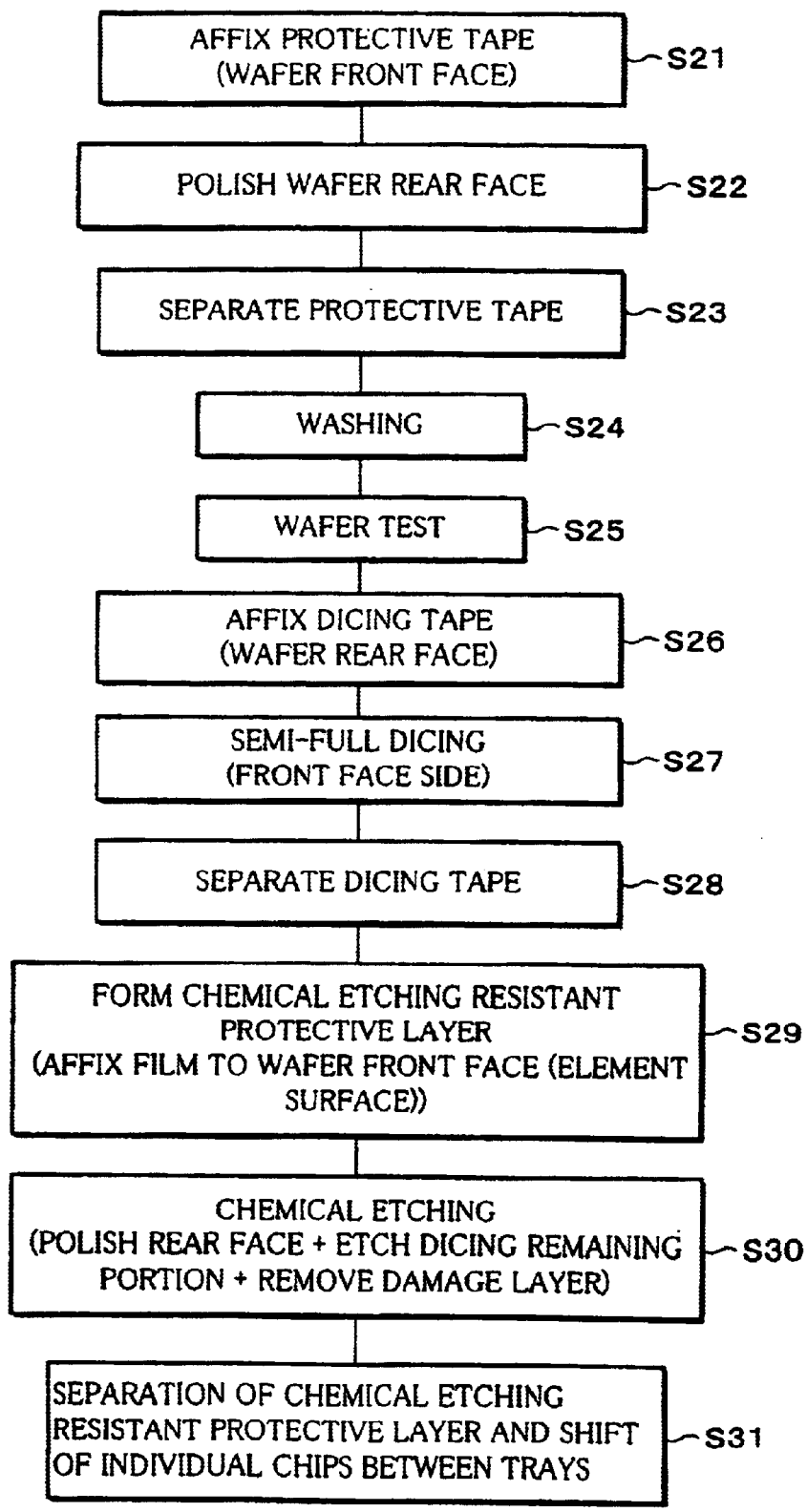
FIG. 9 is a process flow chart that shows a rear-face polishing process and a dicing process of a semiconductor water in a manufacturing method of a semiconductor device in accordance with still another embodiment of the present invention.

Referring to FIGS. 9 an 10, the following description will discuss still another embodiment of the present invention. Here, for convenient explanation, in the present embodiment, those members that have the same functions and that are described in Embodiments 1 and 2 are indicated by the same reference numerals and the description thereof is omitted.

In the manufacturing method of the semiconductor device in accordance with the present embodiment, the rear-face polishing process is carried out prior to the semi-full dicing. Additionally, the method disclosed in the present embodiment can be applied to Embodiments 1 and 2.

Figure 10:
FIG. 10(a) is an explanatory drawing that shows a state in which the semiconductor wafer is processed during the rear-face polishing process and the dicing process in accordance with the process flow chart in the manufacturing method of the semiconductor device shown in FIG. 9.
FIG. 10(b) is an explanatory drawing that shows a state in which the semiconductor wafer is processed during the rear-face polishing process and the dicing process in accordance with the process flow chart in the manufacturing method of the semiconductor device shown in FIG. 9.
FIG. 10(c) is an explanatory drawing that shows a state in which the semiconductor wafer is processed during the rear-face polishing process and the dicing process in accordance with the process flow chart in the manufacturing method of the semiconductor device shown in FIG. 9.
FIG. 10(d) is an explanatory drawing that shows a state in which the semiconductor wafer is processed during the rear-face polishing process and the dicing process in accordance with the process flow chart in the manufacturing method of the semiconductor device shown in FIG. 9.
FIG. 10(e) is an explanatory drawing that shows a state in which the semiconductor wafer is processed during the rear-face polishing process and the dicing process in accordance with the process flow char: in the manufacturing method of the semiconductor device shown in FIG. 9.
FIG. 10(f) is an explanatory drawing that shows a state in which the semiconductor wafer is processed during the rear-face polishing process and the dicing process in accordance with the process flow chart in the manufacturing method of the semiconductor device shown in FIG. 9.
FIG. 10(g) is an explanatory drawing that shows a state in which the semiconductor wafer is processed during the rear-face polishing process and the dicing process in accordance with the process flow chart in the manufacturing method of the semiconductor device shown in FIG. 9.
FIG. 10(h) is an explanatory drawing that shows a state in which the semiconductor wafer is processed during the rear-face polishing process and the dicing process in accordance with the process flow chart in the manufacturing method of the semiconductor device shown in FIG. 9.
FIG. 10(i) is an explanatory drawing that shows a state in which the semiconductor wafer is processed during the rear-face polishing process and the dicing process in accordance with the process flow chart in the manufacturing method of the semiconductor device shown in FIG. 9.
FIG. 10(j) is an explanatory drawing that shows a state in which the semiconductor wafer is processed during the rear-face polishing process and the dicing process in accordance with the process flow chart in the manufacturing method of the semiconductor device shown in FIG. 9.
Figure 10:
Figure 10:
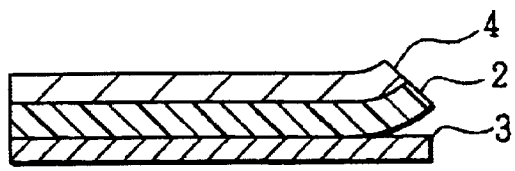
Figure 10:
Figure 10:
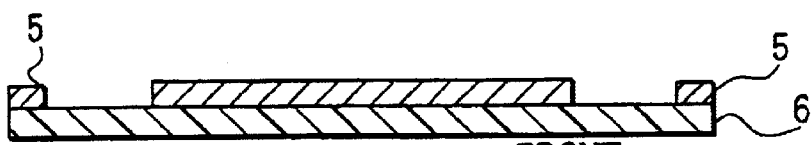
Figure 10:
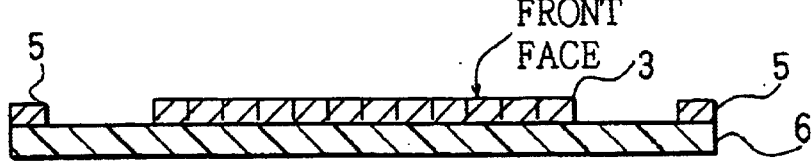
Figure 10:
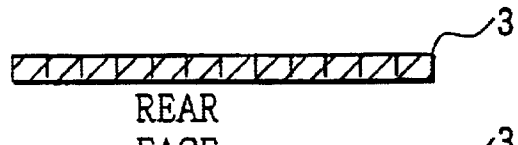
Figure 10:
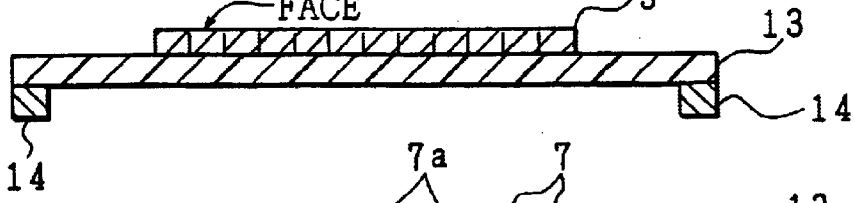
Figure 10:
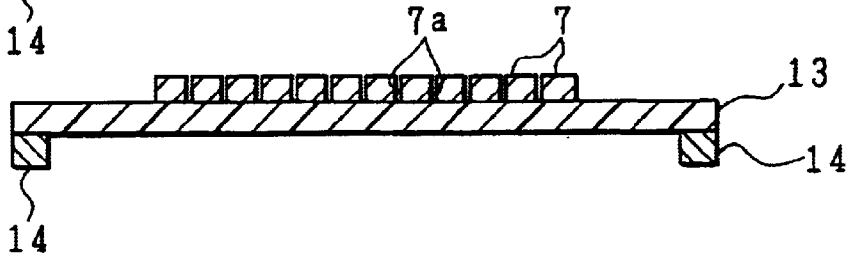
Figure 10:
Figure 13:
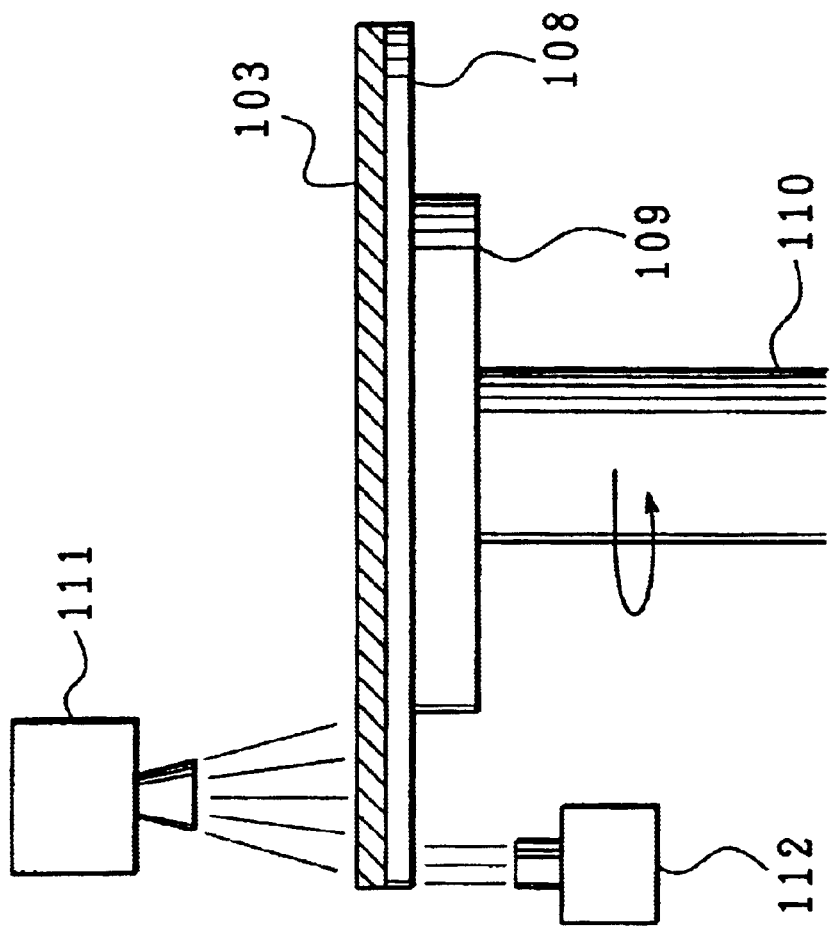
FIG. 13 is an explanatory drawing that shows a chemical etching process in another conventional manufacturing method of a semiconductor device.

Referring to FIGS. 9 and 10, an explanation will be given of processes from the rear-face polishing process to the polishing process in the manufacturing method of the semiconductor device of the present embodiment.

FIG. 9 is a process flow chart that shows processes from the rear-face polishing process to the polishing process of a semiconductor wafer in the manufacturing method of a semiconductor device in accordance with the present embodiment. FIGS. 10(a) through 10(j) are cross-sectional views that show states in which a semiconductor wafer 1 is processed in accordance with the process flow chart shown in FIG. 7.

As illustrated in FIG. 9, the manufacturing method of a semiconductor device in accordance with the present embodiment includes the following processes:

step S21: affixing process for a protective tape step S22: wafer rear-face polishing process (rear-face polishing process)

step S23: separation process for the protective tape step S24: washing process step S25: wafer test process step S26: affixing process for a dicing tape step S27: semi-full dicing process step S28: separation process for the dicing tape step S29: formation process for a protective layer having a chemical etching resistant property step S30: chemical etching process step S31: separation process for the protective layer having a chemical etching resistant property and shifting process of semiconductors between trays (Protective Layer Removing Process)

Therefore, the following description will discuss each of the above-mentioned processes following the sequence of the processes.

*Processes From the Affixing Process for a Protective Layer to the Wafer Test

First, a protective tape 2 formed by stacking an acrylic bonding agent on one surface of a plastic film in order to protect the front face (element formation face) of a semiconductor wafer 1 prior to a rear-face polishing process (S21, FIG. 10(a)). Next, after polishing the rear face of the semiconductor wafer 1 (S22, FIG. 10(b)), the protective tape 2 is separated from the semiconductor wafer 3 after completion of the rear-face polishing process (S23, FIG. 10(c)).

Here, with respect to the separation method for the protective tape 2 in step S23, as shown in FIG. 10(c), a method is proposed in which separation is made by using a separation tape 4 having an adhesive strength greater than the adhesive strength between the protective tape 2 and the semiconductor wafer 3.

Thereafter, the semiconductor wafer 3 having been subjected to the rear-face polishing process is washed by pure water, etc. (S24, FIG. 10(d)), and loaded to the next process after having been subjected to a wafer test (S25, FIG. 10(d)).

*Processes From the Affixing Process for a Dicing Tape to the Separation Process for the Protective Layer Having a Chemical Etching Resistant Property and the Shifting Process of Semiconductors Between Trays With respect to the affixing process for a dicing tape (S26, FIG. 10(e)), the semi-full dicing process (S27, FIG. 10(f)), the separation process for the dicing tape (S28, FIG. 10(g)), the formation process for a protective layer having a chemical etching resistant property (S29, FIG. 10(h)), the chemical etching process (S30, FIG. 10(i)), the separation process for the protective layer having a chemical etching resistant property and the shifting process of semiconductors between trays (S31, FIG. 10(j)) are the same as those carried out in Embodiment 1 (S2 to S7 of FIG. 1 and FIGS. 2(b) to 2(g)).

As described above, with the manufacturing method of a semiconductor device in accordance with the present embodiment, the damaged layer (defective areas), such as a machining-affected layer and fine cracks, on the rear face of a semiconductor wafer resulting from the rear-face polishing process can be removed by the chemical etching; thus, it becomes possible to eliminate an unwanted stress exerted on the polished face and deflection in the semiconductor wafer, which have been conventional problems. Moreover, these effects are particularly advantageous in the manufacturing process of thin-film semiconductor wafers which have difficulties in transporting and handling.

Additionally, the scope of the present invention is not intended to be limited by the above-mentioned embodiments, and various modifications may be made within the scope of the present invention; for example, the following arrangements may be proposed.

The manufacturing method of a semiconductor device of the present invention, which is a semiconductor-wafer polishing and dicing method for dividing the semiconductor wafer into individual devices, may have the steps of: semi-full dicing the semiconductor wafer from the front face (element formation face); forming a protective layer having a chemical etching resistant property on the front face of the semiconductor wafer; removing damaged areas (defective areas), such as a machining-affected layer and fine cracks, on a chip cut face resulting from the semi-full dicing process, by using chemical etching while the front face of the semiconductor wafer is being protected, as well as simultaneously carrying out a wafer rear-face polishing process and a removing process of a dicing residual portion from a semi-full dicing state by the chemical etching so that the semiconductor wafer is divided into individual chips; and removing the protective layer having a chemical etching resistant property.

With this method, the chemical etching makes it possible to simultaneously carry out: the removing process of the damaged layer (defective areas) such as, a machining-affected layer and fine cracks, in the rear face of the semiconductor wafer and the cut face resulted from the rear-face polishing process and the semi-full dicing process; and the removing process of the dicing residual portion from the semi-full dicing state. Thus, it is possible to eliminate the breaking process, to prevent cracks and chips that used to occur at the time of breaking, and consequently to reduce the number of processes.

Moreover, since the semiconductor wafer can be dealt on the basis of each piece as well as on the basis of one lot, it is superior in the working efficiency at the time of mass production, and particularly advantageous in the manufacturing process of thin-film semiconductor wafers which have difficulties in transporting and handling.

The manufacturing method a semiconductor device of the present invention, which is a semiconductor-wafer polishing and dicing method for dividing the semiconductor wafer into individual devices, may have the steps of: forming a protective layer having dicing resistant and chemical etching resistant properties on the front face (element formation face) of the semiconductor wafer; semi-full dicing the semiconductor wafer from the rear face of the semiconductor wafer; removing damaged areas (defective areas), such as a machining-affected layer and fine cracks, on a chip cut face resulting from the semi-full dicing process, by using chemical etching while the front face (element formation face) of the semiconductor wafer is being protected, as well as simultaneously carrying out a wafer rear-face polishing process and a removing process of a dicing residual portion from a semi-full dicing state by the chemical etching so that the semiconductor wafer is divided into individual chips; and removing the protective layer having a chemical etching resistant property.

With this method, when the semi-full dicing method from the rear face is used, it is possible to eliminate the protective tape exchanging process on the semiconductor wafer, consequently to reduce the number of processes, and also to prevent damages, etc., to the semiconductor element due to mishandling, etc. at the time of shifting the semiconductor wafer between processes.

The manufacturing method of a semiconductor device of the present invention, which is a semiconductor-wafer polishing and dicing method for dividing the semiconductor wafer into individual devices, may have the steps of: after polishing the semiconductor wafer prior to dicing, semi-full dicing the semiconductor wafer from the front face (element formation face) or the rear face of the semiconductor wafer; forming a protective layer having a chemical etching resistant property on the front face of the semiconductor wafer; removing damaged areas (defective areas), such as a machining-affected layer and fine cracks, on the rear face of the semiconductor wafer resulting from the rear-face polishing process, as well as damaged areas (defective areas) on a chip cut face resulted from the semi-full dicing process, by using chemical etching while the front face of the semiconductor wafer being protected, as well as simultaneously carrying out a wafer rear-face polishing process and a removing process of a dicing residual portion from a semi-full dicing state by the chemical etching so that the semiconductor wafer is divided into individual chips; and removing the protective layer having a chemical etching resistant property.

In the manufacturing method of a semiconductor device of the present invention, the protective layer having a chemical etching resistant property may be a chemical etching resistant film of any of ultraviolet separation type, thermal foaming type and adhesive type.

In the manufacturing method of a semiconductor device of the present invention, the protective layer having a chemical etching resistant property, which is affixed onto the front face (element formation face) of the semiconductor wafer, may be bonded to a carrier frame made of metal or resin, the entire surface of which is fluororesin-coated.

In the manufacturing method of a semiconductor device of the present invention, the carrier frame may be provided with grooves, having a radial shape, for draining the etchant.

The manufacturing method of a semiconductor device of the present invention may have the steps of: semi-full dicing the semiconductor wafer from the element formation face so as to leave a dicing residual portion having a predetermined thickness on the side of the rear face that is the opposite face to the element formation face of the semiconductor wafer; forming a protective layer having a chemical etching resistant property on the element formation face of the semiconductor wafer; chemically etching the semiconductor wafer having the protective layer formed on its element formation face from the rear face side so as to carry out a rear-face polishing process of the semiconductor wafer, a dividing process of the semiconductor wafer into individual semiconductor chips and a removing process of damaged areas on a cut face of the semiconductor wafer resulted from the semi-full dicing process; and removing the protective layer having a chemical etching resistant property.

With the above-mentioned method, after the semi-full dicing from the element formation face (front face), the semiconductor wafer, which has the protective layer formed on the element formation face, is chemically etched with the element formation face being protected by the protective layer in the chemical etching process so that the rear-face polishing process of the semiconductor wafer, the dividing process into individual semiconductor chips and the removing process of damaged areas such as a machining-affected layer and fine cracks on a cut face of the semiconductor chip resulted from the semi-full dicing process are simultaneously carried out.

In other words, in the chemical etching process, first, the semiconductor wafer is etched from the rear face thereof in the thickness direction of the semiconductor chip. At this time, the dicing residual portion is simultaneously etched from the rear face so that when the etching has reached the thickness of the dicing residual portion (dicing residual amount) left in the semi-full dicing process, the semiconductor wafer is divided into individual semiconductor chips. After the semiconductor chips have been separated, the etchant is allowed to enter a groove between the adjacent semiconductor chips formed in the semi-full dicing process, with the result that the semiconductor chip is etched also in the width direction from its cut face; thus, it is possible to remove damaged areas resulting from the semi-full dicing process.

As described above, with the above-mentioned method, the chemical etching makes it possible to simultaneously carry out the rear-face polishing process of the semiconductor wafer, the dividing process into individual semiconductor chips and the removing process of a damaged layer, such as a machining-affected layer and cracks, in the cut face of the semiconductor chip due to the semi-full dicing process.

Therefore, since the breaking process after the semi-full dicing process, which used to be required conventionally, is no longer necessary, it becomes possible to reduce the number of processes, and also to avoid chips and cracks that would occur during the breaking process. Consequently, it becomes possible to carry out the polishing process and the dicing process safely without causing damages to the semiconductor wafer and without raising the problem of chipping.

The manufacturing method of a semiconductor device of the present invention may have the steps of: forming a protective layer having dicing resistant and chemical etching resistant properties on the element formation face of the semiconductor wafer; semi-full dicing the semiconductor wafer from the side of the rear face that is the opposite face to the element formation face of the semiconductor so as to leave a dicing residual portion having a predetermined thickness on the element formation face side of the semiconductor wafer; chemically etching the semiconductor wafer having the protective layer formed on its element formation face from the rear face side so as to carry out a rear-face polishing process of the semiconductor wafer, a dividing process of the semiconductor wafer into individual semiconductor chips and a removing process of damaged areas on a cut face of the semiconductor wafer resulted from the semi-full dicing process; and removing the protective layer having a chemical etching resistant property.

With the above-mentioned method, the semiconductor wafer, which has been subjected to the semi-full dicing from the rear face after the formation of the protective layer on its element formation face, is chemically etched with the element formation face being protected by the protective layer in the chemical etching process so that the rear-face polishing process of the semiconductor wafer, the dividing process into individual semiconductor chips and the removing process of damaged areas such as a machining-affected layer and fine cracks on a cut face of the semiconductor chip resulted from the semi-full dicing process are simultaneously carried out.

In other words, in the chemical etching process, first, the semiconductor wafer is etched from the rear face thereof in the thickness direction of the semiconductor chip. Simultaneously with this process, since the etchant is allowed to enter a groove between the adjacent semiconductor chips formed in the semi-full dicing process, the dicing residual portion is etched from the rear face side with the result that when the etching has progressed to the dicing residual amount and reached the element formation face of the semiconductor wafer, the semiconductor wafer is divided into semiconductor chips. Moreover, simultaneously with this process, each of the semiconductor chips is subjected to etching also in the width direction from the cut face; thus, it becomes possible to remove the defective areas resulted from the semi-full dicing process.

As described above, with the above-mentioned method, the chemical etching makes it possible to simultaneously carry out the rear-face polishing process of the semiconductor wafer, the dividing process into individual semiconductor chips and the removing process of a damaged layer, such as a machining-affected layer and cracks, in the cut face of the semiconductor chip due to the semi-full dicing process.

Therefore, since the breaking process after the semi-full dicing process, which used to be required conventionally, is no longer necessary, it becomes possible to reduce the number of processes, and also to avoid chips and cracks that would occur during the breaking process. Consequently, it becomes possible to carry out the polishing process and the dicing process safely without causing damages to the semiconductor wafer and without raising the problem of chipping.

In the above-mentioned method, since the semi-full dicing process is carried out from the rear face, it is possible to eliminate the dicing protective tape exchanging process on the semiconductor wafer, consequently to reduce the number of processes, and also to prevent damages, etc., to the semiconductor element due to mishandling, etc. at the time of shifting the semiconductor wafer between processes.

Furthermore, the manufacturing method of the semiconductor device in accordance with the present invention may include the rear-face polishing process for polishing the rear face that is the face opposite to the element formation face of the semiconductor wafer, prior to the semi-full dicing process, and may remove the damaged areas on the rear face of the semiconductor wafer resulting from the rear-face polishing process during the chemical etching process.

The above-mentioned method makes it possible to remove damaged areas such as a machining-affected layer and fine cracks on the rear face of the semiconductor wafer resulting from the rear-face polishing process and damaged areas on a chip cut face resulted from the semi-full dicing process thereafter through the chemical etching process, while protecting the element formation face. Simultaneously with this process, the rear-face polishing process of the semiconductor wafer is carried out, and the dividing process into individual semiconductor chips from a semi-full dicing state is also carried out by removing the dicing residual portion.

In the case of the rear-face polishing process by using only the chemical etching, since the etching is carried out in the dicing width direction, there is a limitation in the amount of chemical etching in the thickness direction; however, by polishing the rear face of the semiconductor wafer prior to the semi-full dicing process, it becomes possible to desirably control the total amount of the rear-face etching, and consequently to manufacture a desired thin-film semiconductor wafer.

Moreover, the manufacturing method of the semiconductor device in accordance with the present invention may be provided with a protective layer holding means having a chemical etching resistant property, which is placed on the periphery of the protective layer in a manner so as to surround the entire circumference of the semiconductor wafer.

In the above-mentioned method, the protective layer holding means is placed on the periphery of the protective layer formed on the semiconductor wafer in a manner so as to surround the entire circumference of the semiconductor wafer; thus, it is allowed to hold the protective layer and also to hold the semiconductor wafer through the protective layer so that even after the semiconductor wafer has been divided into individual semiconductor chips, these chips can be handled with each semiconductor wafer until the protective layer has been separated from the semiconductor chip.

Consequently, the chemical etching can be carried out on the basis of each sheet of the semiconductor wafer or on the basis of one lot including a plurality of sheets thereof; therefore, it is advantageous from the viewpoint of mass production. This superior working efficiency at the time of mass production becomes particularly effective in the manufacturing process of thin-film wafers that have difficulties in transportation and handling.

Moreover, the protective layer holding means is allowed to hold the protective layer to which the semiconductor chips are bonded with a uniform tension so that it is possible to prevent a reduction in the rigidity in the entire semiconductor wafer which occurs when the semiconductor wafer in a semi-full dicing state is divided into individual semiconductor chips following the progress of the chemical etching. As a result, it becomes possible to prevent deviations in the amount of etching due to residual etchant as well as contact between the divided semiconductor chips, caused by deflection in the protective layer occurring at the time of a reduction in the rigidity thereof.

Moreover, in the manufacturing method of the semiconductor device in accordance with the present invention, the protective layer holding means may be provided with a draining means for draining the etchant remaining inside the protective layer holding means during the chemical etching process.

When the semiconductor wafer and the protective layer holding means are placed on the same face with respect to the protective layer, the etchant tends to remain inside the protective layer holding means on the protective layer during the chemical etching process. When the etchant resides around the semiconductor wafer, it is highly possible that a reduction in the etching rate or deviations in the rate might occur depending on places in the semiconductor wafer.

In contrast, in the above-mentioned method, the protective layer holding means is further provided with the draining means for draining the etchant remaining inside the protective layer holding means during the chemical etching process; therefore, this method is free from the above-mentioned problems and consequently provides a stable-etching process.

Moreover, in the manufacturing method of the semiconductor device in accordance with the present invention, the protective layer may be provided as a chemical etching resistant film of a ultraviolet separation type that has a reduction in the adhesive strength upon irradiation with ultraviolet rays.

In the above-mentioned method, the application of the protective layer made of the chemical etching resistant film of a ultraviolet separation type makes it possible to easily control the adhesive strength between the protective layer and the semiconductor wafer.

Therefore, in the protective layer removing process, the protective layer is easily removed from the semiconductor chips that have been divided into individual chips by reducing the adhesive strength between the protective layer and the semiconductor wafer by irradiating the protective layer with ultraviolet rays. This makes it possible to improve the working efficiency of the process for shifting the individual semiconductor chips to trays after the chemical etching process.

Moreover, in the manufacturing method of the semiconductor device in accordance with the present invention, the protective layer may be provided as a chemical etching resistant film of a thermal foaming type that has a reduction in the adhesive strength upon application of heat.

In the above-mentioned method, the application of the protective layer made of the chemical etching resistant film of a thermal foaming makes it possible to easily control the adhesive strength between the protective layer and the semiconductor wafer.

Therefore, in the protective layer removing process, the protective layer is easily removed from the semiconductor chips that have been divided into individual chips by reducing the adhesive strength between the protective layer and the semiconductor wafer by heating the protective layer. This makes it possible to improve the working efficiency of the process for shifting the individual semiconductor chips to trays after the chemical etching process.

Moreover, in the manufacturing method of the semiconductor device in accordance with the present invention, the protective layer may be provided as a chemical etching resistant film of a sticking type which has an adhesive strength that allows the individually divided semiconductor chips to be separated from the protective layer one by one.

The above-mentioned method makes it possible to provide a protective layer having an appropriate adhesive strength that allows the protective layer to be easily separated from the individually divided semiconductor chips in the protective layer removing process.

Therefore, in the protective layer removing process, it becomes possible to eliminate the process for reducing the adhesive force between the protective layer and the semiconductor wafer, and consequently to improve the working efficiency of the process for shifting the individual semiconductor chips to trays after the chemical etching process.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor device comprising:

dicing a semiconductor wafer so as to leave a residual portion with a predetermined thickness between devices on the semiconductor wafer;

providing a protective layer having a chemical etching resistant property on an element formation face of the semiconductor wafer, wherein the protective layer is bonded to the semiconductor wafer using a bonding agent having a chemical etching resistant property and wherein a protective layer holder with radially-extending grooves formed therein is attached to a peripheral portion of the protective layer;

chemically etching with etchant the semiconductor wafer having the protective layer provided on the element formation face from the rear face side so as to polish the rear face of the semiconductor wafer, to remove the residual portion to divide the semiconductor wafer into individual semiconductor chips, and to remove damaged areas on portions of the semiconductor wafer exposed by the dicing; and draining residual etchant from the protective layer holder via the radially-extending grooves formed therein.

2. The method as defined in claim 1, further comprising:
electrically testing the semiconductor wafer prior to dicing.

3. The method as defined in claim 1, further comprising:
removing the protective layer from the semiconductor chips after the chemical etching.

4. The method as defined in claim 3, wherein the protective layer is removed using ultraviolet irradiation.

5. The method as defined in claim 3, wherein the protective layer is removed using heat.

6. The method as defined in claim 1, wherein the dicing of the semiconductor wafer is from the element formation face so as to leave the residual portion with a predetermined thickness on the rear face side of the semiconductor wafer.

7. The method as defined in claim 1, wherein the protective layer is a chemical etching resistant film of a thermal type, which has a reduction in adhesive strength upon application of heat.

8. A manufacturing method for a semiconductor device comprising:

semi-full dicing a semiconductor wafer so as to leave a dicing residual portion with a predetermined thickness between devices on the semiconductor wafer;

providing a protective layer having a chemical etching resistant property on an element formation face of the semiconductor wafer, wherein the protective layer is bonded to the semiconductor wafer using a bonding agent having a chemical etching resistant property and a protective layer holding means is placed on a peripheral portion of the protective layer so as to surround the entire circumference of the semiconductor wafer; and chemically etching the semiconductor wafer having the protective layer provided on the element formation face from the rear face side so as to polish the rear face of the semiconductor wafer, to remove the dicing residual portion to divide the semiconductor wafer into individual semiconductor chips, and to remove damaged areas in a cut face of the semiconductor wafer resulting from the semi-full dicing process, wherein the protective layer holding means has draining means for draining etchant remaining inside the protective layer holding means during the chemical etching and the draining means is formed as grooves in the protective layer holding means which extend in a radial manner.

9. The manufacturing method for a semiconductor device as defined in claim 8, further comprising:

prior to the semi-full dicing, carrying out an electrical test on the semiconductor wafer by means of probing.

10. The manufacturing method for a semiconductor device as defined in claim 8, further comprising:
removing the protective layer from the semiconductor chips after the chemical etching.

11. The manufacturing method for a semiconductor device as defined in claim 8, wherein in the semi-full dicing, the semiconductor wafer is subjected to semi-full dicing from the element formation face so as to leave a dicing residual portion with a predetermined thickness on the rear face side of the semiconductor wafer.

12. The manufacturing method for a semiconductor device as defined in claim 8, wherein in the semi-full dicing, the semiconductor wafer is subjected to semi-full dicing from the rear face so as to leave a dicing residual portion with a predetermined thickness on the element formation face side of the semiconductor wafer.

13. The manufacturing method for a semiconductor device as defined in claim 8, wherein the protective layer is a film.

14. The manufacturing method for a semiconductor device as defined in claim 8, wherein the protective layer is a chemical etching resistant film of an ultraviolet separation type, which has a reduction in adhesive strength upon irradiation with ultraviolet rays.

15. The manufacturing method for a semiconductor device as defined in claim 8, wherein the protective layer is a chemical etching resistant film of a thermal type, which has a reduction in adhesive strength upon application of heat.

16. The manufacturing method for a semiconductor device as defined in claim 8, wherein the protective layer is a chemical etching resistant film of a sticking type, which has an adhesive strength that allows the individually divided semiconductor chips to be separated from the protective layer one by one.

17. The manufacturing method for a semiconductor device as defined in claim 8, wherein the protective layer holding means holds the protective layer with a uniform tension during the chemical etching.

18. The manufacturing method for a semiconductor device as defined in claim 8, wherein uniform tension is maintained on the protective layer by the protective layer holding means and wherein the protective layer holding means is placed on the same surface of the protective layer as the semiconductor wafer.

19. The manufacturing method for a semiconductor device as defined in claim 8, wherein the protective layer holding means has a chemical etching resistant property.

20. The manufacturing method for a semiconductor device as defined in claim 8, wherein the protective layer holding means has a ring shape with a flat bonding face for bonding with the protective layer.

* * * * *

UNITED STATES PATENT AND TRADEMARK OFFICE
CERTIFICATE OF CORRECTION

PATENT NO. : 6,730,579 B1  Page 1 of 1
DATED : May 4, 2004
INVENTOR(S) : Sasaki

It is certified that error appears in the above-identified patent and that said Letters Patent is hereby corrected as shown below:

Title page,
Item [75], Inventors, change "Sasaka" to -- Sasaki --.

Signed and Sealed this

Sixteenth Day of November, 2004

JON W. DUDAS
*Director of the United States Patent and Trademark Office*